US012792303B2

(12) United States Patent
Bertram

(10) Patent No.: US 12,792,303 B2
(45) Date of Patent: Nov. 10, 2026

(54) METHOD OF PERFORMING A NUMERICAL SOLVING PROCESS

(71) Applicant: Talos Innovation ApS, Copenhagen (DK)

(72) Inventor: Finlay Bertram, Copenhagen (DK)

(73) Assignee: Talos Innovation ApS, Copenhagen (DK)

( * ) Notice: Subject to any disclaimer, the term of this patent is extended or adjusted under 35 U.S.C. 154(b) by 0 days.

(21) Appl. No.: 19/529,622

(22) Filed: Feb. 4, 2026

(65) Prior Publication Data

US 2026/0169689 A1 Jun. 18, 2026

Related U.S. Application Data

(63) Continuation of application No. 18/573,361, filed as application No. PCT/EP2022/068305 on Jul. 1, 2022.

(30) Foreign Application Priority Data

Jul. 1, 2021 (GB) ...................................... 2109513

(51) Int. Cl.
*G06F 7/38* (2006.01)
*G01V 20/00* (2024.01)
*G06F 30/27* (2020.01)

(52) U.S. Cl.
CPC ................ *G06F 7/38* (2013.01); *G01V 20/00* (2024.01); *G06F 30/27* (2020.01)

(58) Field of Classification Search
CPC ............ G06F 7/38; G06F 30/27; G01V 20/00
See application file for complete search history.

(56) References Cited

U.S. PATENT DOCUMENTS

2007/0179766 A1 8/2007 Cullick et al.
2013/0096899 A1 4/2013 Usadi et al.
(Continued)

FOREIGN PATENT DOCUMENTS

CN 106055736 A 10/2016
CN 111985064 A 11/2020
(Continued)

OTHER PUBLICATIONS

Bezenac , et al., "Deep Learning for Physical Processes: Incorporating Prior Scientific Knowledge", arXiv, Jan. 9, 2018 (15 pages).
(Continued)

*Primary Examiner* — Chuen-Meei Gan
(74) *Attorney, Agent, or Firm* — Proskauer Rose LLP

(57) ABSTRACT

A method of performing a physics-based simulation of one or more fluids in a subterranean reservoir or environment includes obtaining time step information for a current time step and predicting an initial estimate for a subsequent time step using the obtained current time step information. The method also includes transmitting the predicted initial estimate for the subsequent time step from a first processing resource to a second processing resource and providing the predicted initial estimate for the subsequent time step to a numerical solver. The method further includes performing an iterative process for the subsequent time step using the numerical solver and the predicted initial estimate for the subsequent time step to obtain a numerical solution for the subsequent time step.

20 Claims, 5 Drawing Sheets

(56) References Cited

U.S. PATENT DOCUMENTS

| | | | | |
|---|---|---|---|---|
| 2013/0304679 | A1 | 11/2013 | Fleming et al. | |
| 2017/0045880 | A1 | 2/2017 | Melville et al. | |
| 2017/0336811 | A1 | 11/2017 | Stone et al. | |
| 2018/0210977 | A1 | 7/2018 | Baddourah et al. | |
| 2020/0202056 | A1 * | 6/2020 | Samson | G01V 20/00 |
| 2020/0264249 | A1 | 8/2020 | Tayli et al. | |
| 2020/0293594 | A1 * | 9/2020 | Raissi | G06F 30/27 |
| 2020/0320386 | A1 | 10/2020 | Filippov et al. | |
| 2020/0401672 | A1 | 12/2020 | Van Der Velden | |
| 2021/0064802 | A1 | 3/2021 | Albert et al. | |
| 2022/0283336 | A1 * | 9/2022 | Shaalan | E21B 49/00 |

FOREIGN PATENT DOCUMENTS

| | | | |
|---|---|---|---|
| CN | 112115560 | A | 12/2020 |
| CN | 113052371 | B | 5/2022 |
| CN | 111027240 | B | 5/2023 |
| EP | 3647972 | A1 | 5/2020 |
| EP | 3772021 | A1 | 2/2021 |
| WO | 2018236238 | A1 | 12/2018 |
| WO | 2023275370 | A1 | 1/2023 |

OTHER PUBLICATIONS

Examination Report for GB 2109513.8 dated Oct. 25, 2023.

International Preliminary Report on Patentability for PCT/EP2022/068305 dated Jan. 11, 2024 (8 pages).

International Search Report for PCT/EP2022/068305 dated Oct. 10, 2022 (4 pages).

Kourakos , et al., "Pumping optimization of coastal aquifers based on evolutionary algorithms and surrogate modular neural network models", Advances in Water Resources, vol. 32, No. 4, Apr. 2009, pp. 507-521, https://doi.org/10.1016/j.advwatres.2009.01.001.

Obiols-Sales , et al., "CFDNet: A deep learning-based accelerator for fluid simulations", UC Irvine Previously Published Works, Jun. 29, 2020, DOI: 10.1145/3392717.3392772 (13 pages).

Search Report for GB 2109513.8 dated Dec. 10, 2021.

Wang, Yanwei , et al., "Development of a deep learning-based model for the entire production process of steam-assisted gravity drainage (SAGD)", Fuel, vol. 287, Mar. 1, 2021, 119565, ISSN 0016-2361, https://doi.org/10.1016/j.fuel.2020.119565.

Written Opinion for PCT/EP2022/068305 dated Oct. 10, 2022 (7 pages).

* cited by examiner

Algorithm 1: Time-stepping Scheme - $\boldsymbol{x}^{t+1} = \text{timeStep}(\boldsymbol{x}_0^{t+1}, \Delta t)$ while $k < k_{max}$ do
- Compute properties
- Compute residuals $\boldsymbol{r}$
- if *converged and* $k > 0$ then
  - $\boldsymbol{x}^{t+1} = \boldsymbol{x}_k^{t+1}$
  - break
- end
- Compute Jacobian $\boldsymbol{J}$
- Solve for $\boldsymbol{h}$ in $\boldsymbol{J}\boldsymbol{h} = -\boldsymbol{r}$
- Update solution $\boldsymbol{x}_{k+1}^{t+1} = \boldsymbol{x}_k^{t+1} + \boldsymbol{h}$
- $k = k + 1$ end

FIG. 3

METHOD OF PERFORMING A NUMERICAL SOLVING PROCESS

CROSS REFERENCE TO RELATED APPLICATIONS

This application is a continuation of U.S. application Ser. No. 18/573,361, filed Dec. 21, 2023, which is a U.S. national stage entry under 35 U.S.C. § 371 of International Application No. PCT/EP2022/068305, filed Jul. 1, 2022, entitled "METHOD OF PERFORMING A NUMERICAL SOLVING PROCESS." The '305 PCT claims priority to, and the benefit of, GB Application Serial No. 2109513.8, filed on Jul. 1, 2021, entitled "METHOD OF SIMULATING FLUIDS IN A SUBTERRANEAN ENVIRONMENT." Each of the foregoing applications are hereby incorporated by reference in their entirety for all purposes.

FIELD

The present invention relates to a method of performing a numerical solving process, for example, a numerical solving process representative of a real or virtual system or process, for example, one or more fluids in a reservoir or environment, for example, an oil or gas or other hydrocarbon reservoir.

BACKGROUND

It is known to perform computer-based simulations of oil, gas and other hydrocarbon reservoirs to allow prediction of an aspect of the reservoir. For example, the simulation may predict fluid flow in the reservoir, production and injection from wells or flow in a pipeline It is known to apply grid-based models, for example, finite element or finite volume or finite difference models to represent an oil, gas or other hydrocarbon reservoir. Such grid-based models typically involve representing the reservoir using a grid or mesh and solving a system of equations using a numerical solver.

There are many reasons for performing such simulations, including one or more of the following: a testing or optimization of a design parameter, for example, of a piece of equipment or machinery in use at the reservoir site; evaluation of the production or performance of the reservoir project and/or to quantify uncertainty in the simulated system.

There may be problems using known grid-based models, for example, the simulation time may be very long (for example, many days). This time may be longer if the real-world domain being modelled is more complex. While steps have been made to improve the simulation times for the processing step of a simulation workflow (for example, using parallel processing), there are limitations on how far a numerical solver can be parallelized due to the co-dependencies of grid cells and hardware limitations. In addition, the number of different combinations of input parameters for the physics-based model means that using a brute force technique to find optimal parameters for a simulation run is not possible, in practice.

In the context of oil, gas and other hydrocarbon reservoir simulations, it is known to use a proxy model in the place of a full physics-based simulation, for example, it is known to use a proxy model based on artificial neural networks, to approximate and infer the results of a full physics-based simulation. In such methods, the trained proxy model is intended to replace the full-physics-based simulation.

SUMMARY

According to a first aspect there is provided a computer-implemented method of performing a physics-based simulation of one or more fluids in a subterranean reservoir or environment, wherein the physics-based simulation comprises performing an iterative process using a numerical solver for one or more times steps to obtain a numerical solution for each of the one or more time steps, wherein performing the iterative process at each time step comprises providing an initial estimate to the numerical solver and applying the numerical solver to a set of equations representative of the one or more fluids in the subterranean reservoir or environment. The method may comprise, for a current time step of the one or more time steps: obtaining time step information for the current time step; predicting an initial estimate for a subsequent time step using the obtained current time step information wherein predicting the initial estimate uses a predictive model characterized by one or more model parameters that are pre-determined using a statistical and/or machine learning derived process; and performing an iterative process using the numerical solver for the subsequent time step thereby to obtain a numerical solution for the subsequent time step, wherein performing the iterative process comprises providing at least the predicted initial estimate to the numerical solver.

The physics-based simulation may comprise simulating one of more aspects of the fluid flow in the reservoir or environment based on a known computational fluid dynamics model. The simulation may comprise a simulation of an oil, gas or other hydrocarbon reservoir, a geothermal reservoir or a carbon capture sequestration and storage system. The numerical solution may be a value for one or more quantities of interest of the fluid and/or the environment. The numerical solution may be representative of, for example, one or more of pressure and saturation of the one or more fluids. The set of equations may be a set of linear equations. The set of equations may be derived by linearizing a non-linear differential equation.

The physics-based simulation comprises solving at least one time-dependent partial differential equation. Solving the at least one time-dependent partial differential equation may comprise performing a spatial and/or time discretization process. Solving the at least one time-dependent partial differential equations may comprise solving a set of equations over a sequence of time steps. The equations may be linearized equations corresponding to the at least one partial differential equation. The solution may comprise variables found by solving the system of equations. The intermediate time step information may comprises results from intermediate calculations at a given time-step used to set up the linearized system of equations. The linearized system of equations correspond to the non-linear partial differential equation. The non-linear partial differential equation may be solved iteratively by linearizing the equation such that a set of linear equations may be solved at multiple times, thus converging to the non-linear solution.

By using a predicted value for the initial estimate, performance of the simulation may be improved. For example, the time for the subsequent iterative process to obtain a solution may be reduced and/or the number of iterations for subsequent time steps may be improved. For example, a better start-guess may allow fewer iterations in the subsequent time step to obtain a converged solution. Fewer iterations may result in less computational time. The predictive model may be such that the predicted initial estimate for the subsequent time step may be closer to the obtained numerical solution for the second time step than the numerical solution for the first time step. The predicted initial estimate may avoid divergence of the iteration process, which may occur for long time steps. Therefore, in this case, longer time-steps may be taken therefore reducing the overall simulation time. Using a predicted value for the initial estimate, rather than, for example, the numerical solution from the previous time step, may allow for fewer computational resources and/or less computation time to be used.

The time step information may comprise information generated during the iterative process of the current time step and/or information used by the numerical solver during the iterative process of the current time step.

Obtaining the time step information may comprise updating values for one or more properties for the current time step using the solutions from one or more preceding time steps and/or time step information from the previous time step.

The time step information may comprise dynamic properties and static properties and/or performance indicators indicative of a performance of the simulation and/or iterative process.

The information generated during the current time step may comprise at least one of: the numerical solution for the current time step, $1^{st}$ derivate information, $2^{nd}$ derivate information, higher order derivative information, information relating to the number of iterations performed during the iteration process of the current time step; values for one or more dynamic properties of the fluid or reservoir or environment. The $1^{st}$, $2^{nd}$ and higher order derivative information may comprise $1^{st}$, $2^{nd}$ and higher time or spatial derivatives of the numerical solution for the current time step. The $1^{st}$, $2^{nd}$ and higher order derivative information may comprise $1^{st}$, $2^{nd}$ and higher time or spatial derivatives of one or more grid properties.

The information used during the iterative process of the current time step may comprise at least one of: information related to a spatial discretization process, physical simulation information and real world information. Information related to the spatial discretization process may comprise, for example, a spatial discretization parameter, a grid or volume size, shape or number or time discretization parameter, for example, a time step size. The physical simulation information may comprise, for example: at least one parameter representative of a characteristics of the real or virtual system or process, for example, porosity, permeability, flow conduit, fluid saturation, geometry, viscosity, density, mechanical strength. The physical simulation information may be used as part of the set of equations. The real world information may comprise, for example, sensor data associated with the system or process, for example, data associated with the environment and/or structure and/or object, for example, geometric data, pressure data, temperature data, flow rate data, material property data.

The information related to a spatial discretization process, physical simulation information and real world information may correspond to either information generated during the simulation and/or iterative process or information used during the simulation and/or iterative process.

The current time step information may comprise at least the obtained numerical solution for the current time step. Predicting the initial estimate for the subsequent time step may comprise providing the obtained numerical solution for the current time step and/or a quantity derived from the obtained numerical solution for the current time step to the prediction model. Predicting the initial estimate for the subsequent time step may comprise providing a relative change in the obtained numerical solution for the current time step, relative to the preceding time step or other previous time step, to the prediction model. The obtained numerical solution and a change in numerical solution relative to the preceding time step or other previous time step may be provided to the prediction model.

The physics-based simulation may comprise performing an iterative process for a plurality of time steps to obtain a numerical solution for each of the plurality of time steps. The physics-based simulation comprise using a discretized spatial model, for example, at least one of a grid-based or finite element or finite volume or finite difference model.

The physics-based simulation may comprise performing an iterative process at each time step of a sequence of time steps to obtain a numerical solution for each successive time step of the sequence of time steps wherein the method further comprises using time step information for each time step to predict an initial estimate for the iterative process for the following time step in the sequence of time steps.

The current time step and the subsequent time step may be separated by a time step interval, wherein the method further comprises performing an adaptive time-step scheme in which the time step interval is determined based on the convergent behavior of the iteration process. The time step interval for the current or subsequent time step may be decreased in response to the solution failing to converge within a desired time or number of iteration steps. The method may comprise repeating the iterative process for the current time step in response to the solution not meeting a convergence condition.

The iteration process for the current time step may be repeated in response to the solution not meeting a convergence condition. The subsequent time step may be the time step immediately following the current time step in the sequence of time steps. The time-step interval may be determined in accordance with an adaptive time step scheme.

The simulation may generate output data. The output data may be processed to obtain a value for a design parameter, a system parameter, a process parameter or a control parameter. The output data may be used to visualize the system or process.

The method may comprise processing said output data to determine a control parameter for a controllable piece of equipment or apparatus, for example, the placement of casing strings or to determine the mud weight of the mud used during the drilling operation. The method may further comprise controlling the controllable piece of equipment or apparatus to perform the drilling. The method may comprise processing said output data to determine dimension of the reservoir and/or the environment. The method may comprise processing said output data to determine a predicted production rate. The method may comprise processing said output data to determine a control parameter or other drilling parameter, for example, a predicted drilling site for a drilling operation. The method may further comprises performing the drilling operation at the predicted drilling site. The method may comprise processing said output data to determine an operational parameter for one or more aspects of the reservoir and/or for a drilling process, for example, position of wells, number of wells, equipment used in the well completion, injection pressure, location of a platform or a choke setting. The method may comprise operating one or more aspects of the reservoir and/or the drilling process in accordance with the determined operational parameter. The method may comprise processing said output data to determine a design parameter of a reservoir apparatus, for example, a design parameter for a pipeline. The method may manufacturing the reservoir apparatus based on the determined design parameter. The method may comprise processing said output data to determine an uncertainty in one or more parameters used by the simulation.

The numerical solution may be representative of at least one physical property or quantity of the one or more fluids and/or the reservoir or environment, for example, at least one of liquid flow rates, pressure, temperature, a fluid property, a mechanical property. The numerical solution may be representative of one or more of: porosity, permeability, flow conduit, fluid saturation, geometry, viscosity, density, mechanical strength.

The method may comprise performing an iterative process at a time step that is associated with a transient state of the real or virtual system or process. One or more of the plurality of time steps may be associated with a transient state. The numerical solution for one or more of the plurality of time steps may not correspond to a steady state solution for the physics-based simulation. The plurality of time steps may comprise a first set of time steps corresponding to a transient phase and a second set of time steps corresponding to a steady state phase.

The physics-based simulation may use a physical model of the one or more fluids in the reservoir or environment, for example, a model based on one or more physical principles, rules or constraints and the prediction model is derived using a statistical or machine learning derived process. The prediction model may comprise model parameters associated with a model architecture and wherein the untrained model parameters are independent of the physics-based simulation. The model architecture may be independent of the physics-based simulation. The prediction model may comprise an artificial neural network based model.

The prediction model may be representative of a relationship between one or more input features based on the time step information of the current time step and an output comprising a predicted initial estimate for the subsequent time step. The relationship may comprise or be represented by a mathematical transformation between a representation of the one or more input features and a representation of the output.

The numerical solver may comprise one or more of: a Newton iteration based method, a Runge-Kutta based method. The method may further comprise performing a refinement process of the prediction model using time step information from a time step, wherein the refinement process further comprises updating values of the one or more model parameters. The refinement process may use time step information from one or more time steps of a plurality of completed simulations. The refinement process may use time step information form a pre-determined subset of time steps. The refinement process may comprise selecting the time step information to be used.

The method may further comprise generating a data representation of the physical or virtual system and storing the data representation in a non-transitory, computer readable medium based, as least in part, on the results of the simulation.

In accordance with a second aspect, there is provided an apparatus comprising a processing resource configured to perform a physics-based simulation of one or more fluids in a subterranean reservoir or environment wherein the physics-based simulation comprises performing an iterative process using a numerical solver for one or more times steps to obtain a numerical solution for each of the one or more time steps, wherein performing the iterative process at each time step comprises providing an initial estimate to the numerical solver and applying the numerical solver to a set of equations representative of the one or more fluids in the reservoir or environment. For a current time step of the one or more time steps, the processing resource may be configured to: obtain time step information for the current time step; predict an initial estimate for a subsequent time step using the obtained current time step information wherein predicting the initial estimate uses a predictive model characterized by one or more model parameters that are pre-determined using a statistical and/or machine learning derived process; and perform an iterative process using the numerical solver for the subsequent time step thereby to obtain a numerical solution for the subsequent time step, wherein performing the iterative process comprises providing at least the predicted initial estimate to the numerical solver.

The predictive model may be obtained from a further processing resource, for example, over a network. The iterative process may generate output data and the processing resource may be configured to transmit the generated output data to a further processing resource for processing.

In accordance with a third aspect, which may be provided independently, there is provided a computer-implemented method of training a prediction model for use in performing a physics-based simulation of one or more fluids in a subterranean reservoir or environment comprising: obtaining simulation data for a plurality of runs of the physics-based simulation, wherein the simulation data comprises time step information for each run of the physics-based simulation, the time step information comprising at least a numerical solution obtained using an iterative process for each time step; performing a statistical or machine learning derived process using the time step information to determine model parameters for a prediction model such that the determined model parameters form a prediction model relating time step information for a current time step to an initial estimate for an iterative process for a subsequent time step; storing the plurality of values for the model parameters of the predictive model.

The training process may comprise providing at least the time step information for a time step as an input to the prediction model. The training process may comprises performing a statistical or machine learning derived process to determine a plurality of values for the prediction model parameters. The statistical or machine learning derived process performed on the simulation data may comprise performing an optimization process to optimize an error function. The statistical or machine learning derived process may comprise changing model parameters to optimize a function that is dependent on the numerical solution obtained for a time step and the prediction from the prediction model. The simulation data may form part of the ensemble data.

The method may further comprise performing a refinement process of the model parameters in response to receiving further simulation data thereby to update the values of the model parameters. The simulation data may comprise historical time step data. The simulation data may comprise historical time step data over the lifetime of the system and/or process being simulated. The simulation data may comprise initial, final and intermediate time step data for previous simulation runs.

The method may further comprise obtaining simulation data from one or more computing resources over a network, and providing the determined model parameters to one or more remote computing resources.

In accordance with a fourth aspect, there is provided an apparatus comprising a processing resource configured to train a prediction model for use in performing a physics-based simulation of one or more fluids in a subterranean environment or system, wherein the processing resource is configured to: obtain simulation data for a plurality of runs of the physics-based simulation, wherein the simulation data comprises time step information for each run of the physics-based simulation, the time step information comprising at least a numerical solution obtained using an iterative process for each time step; perform a statistical or machine learning derived process using the time step information to determine model parameters for a prediction model such that the determined model parameters form a prediction model relating time step information for a current time step to an initial estimate for an iterative process for a subsequent time step and store the plurality of values for the model parameters of the predictive model.

The simulation data may be obtained, over a network, from a further processing resource. The model parameters may be transmitted, over a network, to a further processing resource for use.

In accordance with a fifth aspect, which may be provided independently, there is provided a computer-implemented method for performing a numerical solving process using a numerical solver for one or more times steps to obtain a numerical solution for each of the one or more time steps, wherein performing the numerical solving process at each time step comprises providing an initial estimate to the numerical solver and applying the numerical solver to a set of equations, wherein the method comprises, for a current time step of the one or more time steps: obtaining time step information for the current time step; predicting an initial estimate for a subsequent time step using the obtained current time step information wherein predicting the initial estimate uses a predictive model characterized by one or more model parameters that are pre-determined using a statistical and/or machine learning derived process; and performing a numerical solving process using the numerical solver for the subsequent time step thereby to obtain a numerical solution for the subsequent time step, wherein performing the numerical solving process comprises providing at least the predicted initial estimate to the numerical solver. The set of equations may be representative of a real or virtual system of process.

The numerical solving process may comprise an iterative process. The numerical solving iterative process may form part of a physics based simulation. The method may comprise controlling a physics based simulation. The physics-based simulation may comprise a simulation of a real or virtual system or process. The set of equations may be a linear set of equations. The set of equations may be linearized set of equations. The set of equations may be representative of the real or virtual system or process being simulated.

The numerical solving process may be performed on at least one first processing resource. The predicting the initial estimate may be performed on at least one second processing resource. The first processing resource may be provided remotely from the second processing resource, and may communicate, for example, over a network. The method may comprise transmitting at least the predicted initial estimate for a subsequent time step from the first processing resource to the second processing resource and performing the numerical solving process using the numerical solver using the received predicted initial estimate. The method may further comprise, for a subsequent time step, transmitting at least the obtained numerical solution from the second processing resource to the first processing resource.

The simulation may comprise simulating one of more aspects of fluid flow in the real or virtual system or process, for example, based on a known computational fluid dynamics model. One of more aspects of fluid flow in the real or virtual system or process may comprise one or more properties or parameters associated with fluid flow. The simulation may comprise a simulation of an oil, gas or other hydrocarbon reservoir. The simulation may comprise a simulation of a geothermal reservoir. The simulation may comprise a simulation of a wind turbine, an aerofoil, a water reservoir and/or form part of a graphic rendering process. The simulation may comprise a simulation of at least part of the real of virtual system or process. The simulation may comprise a simulation of a parameter or property associated with at least part of the real of virtual system simulation.

The real or virtual system or process being simulated may comprise one or more of an environment and/or structure and/or objects. The simulation may comprise simulating at least part of the environment and/or structure and/or objects. The simulation may comprise simulating a change in at least part of the environment and/or structure and/or objects. The simulation may comprise determining a value for a parameter and/or property associated with one or more of an environment and/or structure and/or objects and/or a change in said property or parameter. The real or virtual system or process being simulated may comprise a change in one or more of an environmental or structural property. The simulation may comprises determining a change in one or more of an environmental or structural property of the real or virtual system or process.

The numerical solution may be representative of at least one physical property or quantity of the one or more aspects of the real or virtual system or process, for example, a property of a fluid flow in the real or virtual system or process. The one or more aspects of the real or virtual system or process may comprise, for example, a property or parameter associated with at least part of the system or process.

The real or virtual system or process may be a time-dependent process or system. The real or virtual system or process may be a process that comprises a steady-state. The real or virtual system of process may comprise a change of state. The real or virtual process may be a system or process that does not comprise a steady-state. The real or virtual system or process may be at least one of: a chaotic and/or an oscillating process. The real or virtual system or process may exhibit non-linear behavior.

The physics-based simulation may use or be based on a physical model of the real or virtual system or process, for example, a model based on one or more physical principles, rules or constraints and the prediction model is derived using a statistical or machine learning derived process.

The method may comprise processing said output data to determine a control parameter for a controllable piece of equipment or apparatus. The method may comprise processing said output data to determine dimension of the process and/or system. The method may comprise processing said output data to determine a predicted production rate. The method may comprise processing said output data to determine a control parameter for the process and/or system. The method may comprise processing said output data to determine an operational parameter for the process and/or system.

The method may comprise processing said output data to determine a design parameter for the process and/or system. The method may comprise processing said output data to determine an uncertainty in one or more parameters used by the simulation.

Solving the at least one time-dependent partial differential equation may comprise performing a spatial and/or time discretization process. The physics-based simulation may comprise solving at least one time-dependent partial differential equation. Solving the at least one time-dependent partial differential equations may comprise solving a set of equations over a sequence of time steps.

The time step information may comprise information generated during the iterative process of the current time step and/or information used by the numerical solver during the iterative process of the current time step. Obtaining the time step information may comprise updating values for one or more properties for the current time step using the solutions from one or more preceding time steps and/or time step information from the previous time step. The information generated during the current time step may comprise at least one of: the numerical solution for the current time step, $1^{st}$ derivate information, $2^{nd}$ derivate information, higher order derivative information, information relating to the number of iterations performed during the iteration process of the current time step; values for one or more dynamic properties of the real or virtual process or system. The information used during the iterative process of the current time step may comprise at least one of: information related to a spatial discretization process, physical simulation information and real world information. The current time step information may comprise at least the obtained numerical solution for the current time step and wherein predicting the initial estimate for the subsequent time step comprises providing the obtained numerical solution for the current time step or a quantity derived from the obtained numerical solution for the current time step to the prediction model.

The physics-based simulation may comprise performing an iterative process at each time step of a sequence of time steps to obtain a numerical solution for each successive time step of the sequence of time steps wherein the method further comprises using time step information for each time step to predict an initial estimate for the iterative process for the following time step in the sequence of time steps.

The current time step and the subsequent time step may be separated by a time step interval and the method may further comprise performing an adaptive time-step scheme in which the time step interval is determined based on the convergent behavior of the iteration process. The time step interval for the current or subsequent time step may be decreased in response to the solution failing to converge within a desired time or number of iteration steps.

The numerical solution may be representative of at least one physical property or quantity of a fluid, for example, at least one of: a liquid flow rate, pressure, temperature, a fluid property, a mechanical property. Performing an iterative process at a time step may be associated with a transient state of the real or virtual system or process.

The prediction model may comprise model parameters associated with a model architecture and wherein the untrained model parameters are independent of the physics-based simulation. The prediction model may comprise an artificial neural network based model. The prediction model may be representative of a relationship between one or more input features based on the time step information of the current time step and an output comprising a predicted initial estimate for the subsequent time step and/or wherein the relationship comprises a mathematical transformation between a representation of the one or more input features and a representation of the output.

The prediction model may comprise an artificial neural network based model. The numerical solver may comprises one or more of: a Newton iteration based method, a Runge-Kutta based method.

The real or virtual system or process may comprises one or more of an environment and/or structure and/or objects and/or a change in one or more of an environmental or structural property. The numerical solution may be representative of at least one physical property or quantity of one or more aspects of the real or virtual system or process. The real or virtual system or process may comprise a time-dependent process or system. The real or virtual system or process may comprise a process that comprises a steady-state and/or the real or virtual system of process comprises a change of state or the real or virtual process is a system or process that does not comprise a steady-state.

The method may comprise outputting and/storing simulation output data. The method may comprise processing said output data to determine at least one of: a) a control parameter for a controllable piece of equipment or apparatus; b) a dimension of the process and/or system being simulated; c) a control parameter for the process and/or system being simulated; d) an operational parameter for the process and/or system being simulated; e) a design parameter for the process and/or system; f) an uncertainty in one or more parameters used by the simulation. The set of equations may be representative of one or more aspects of fluid flow based on a known computational fluid dynamics model.

The numerical solving process may use real world information and the method may comprise performing one or more measurements to obtain data representative of the real world information. The method may comprises obtaining sensor data representative of real world information and using said real world information as part of the numerical solving process.

The set of equations may be representative of at least one aspect of: a) an oil, gas or other hydrocarbon reservoir, a geothermal reservoir or a carbon capture sequestration and storage system; b) a wind turbine, an aerofoil, a water reservoir; c) a virtual object or environment that is the subject of a graphic rendering process. The set of equations may be representative of a subterranean reservoir and wherein the method comprises generating output data from the numerical solving process and processing said output data to determine at least one of:

a) a control parameter for a controllable piece of equipment or apparatus, for example, for performing a drilling operation and wherein the method comprises optionally controlling the controllable piece of equipment or apparatus;
b) a dimension of an oil and gas or other subterranean reservoir;
c) a predicted production rate from the subterranean reservoir;
d) a proposed drilling site and, optionally, wherein the method comprises performing drilling at the proposed drilling site;
e) an operational parameter for one or more aspects of a reservoir and/or for a drilling process, for example, position of wells, number of wells, equipment used in the well completion, injection pressure, location of a platform or choke setting and, optionally, performing the drilling process in accordance with the operational parameter;

f) a design parameter of a reservoir apparatus, for example, a position of a gas-lift valve, the type of electrical submersible pump or the position of an inflow control device, and optionally wherein the method comprises manufacturing the reservoir apparatus in accordance with the design parameter;

g) an uncertainty in one or more parameters used by the numerical solver process.

The numerical solution may be representative of at least one physical property or quantity of fluid and/or reservoir or environment, for example, at least one of liquid flow rates, pressure, temperature, a fluid property, a mechanical property, for example, in a subterranean environment.

In accordance with a sixth aspect, there is provided an apparatus comprising a processing resource configured to perform a numerical solving process using a numerical solving for one or more times steps to obtain a numerical solution for each of the one or more time steps, wherein performing the iterative process at each time step comprises providing an initial estimate to the numerical solver and applying the numerical solver to a set of equations. For a current time step of the one or more time steps, the processing resource may be configured to: obtain time step information for the current time step; predict an initial estimate for a subsequent time step using the obtained current time step information wherein predicting the initial estimate uses a predictive model characterized by one or more model parameters that are pre-determined using a statistical and/or machine learning derived process; and perform a numerical solving process using the numerical solver for the subsequent time step thereby to obtain a numerical solution for the subsequent time step, wherein performing the numerical solving process comprises providing at least the predicted initial estimate to the numerical solver. The physics-based simulation may comprise a simulation of a real or virtual process or system. The set of equations may be representative of the real or virtual process or system.

According to a seventh aspect, which may be provided independently, there is provided a computer-implemented method of training a prediction model for use in a numerical solving process comprising: obtaining training data comprising time step information for a plurality of time steps, wherein the time step information comprises at least a numerical solution obtained using a numerical solving process for each time step; performing a statistical or machine learning derived process using the time step information to determine model parameters for a prediction model such that the determined model parameters form a prediction model relating time step information for a current time step to an initial estimate for a numerical solving process for a subsequent time step. The method may further comprise storing the plurality of values for the model parameters of the predictive model.

According to eight aspect, there is provided an apparatus comprising a processing resource configured to train a prediction model for use in performing a numerical solving process, wherein the processing resource is configured to: obtain training data comprising time step information for a plurality of times steps wherein the time step information comprises at least a numerical solution obtained using a numerical solving process for each time step; perform a statistical or machine learning derived process using the time step information to determine model parameters for a prediction model such that the determined model parameters form a prediction model relating time step information for a current time step to an initial estimate for an iterative process for a subsequent time step. The system may further comprises a memory for storing the plurality of values for the model parameters of the predictive model.

In accordance with a ninth aspect, which may be provided independently, there is provided a computer-implemented method of performing a physics-based simulation wherein the physics-based simulation comprises performing an iterative process using a numerical solver for one or more times steps to obtain a numerical solution for each of the one or more time steps, wherein performing the iterative process at each time step comprises providing an initial estimate to the numerical solver and applying the numerical solver to a set of equations, wherein the method comprises, for a current time step of the one or more time steps: obtaining time step information for the current time step;

predicting an initial estimate for a subsequent time step using the obtained current time step information wherein predicting the initial estimate uses a predictive model characterized by one or more model parameters that are pre-determined using a statistical and/or machine learning derived process; and performing an iterative process using the numerical solver for the subsequent time step thereby to obtain a numerical solution for the subsequent time step, wherein performing the iterative process comprises providing at least the predicted initial estimate to the numerical solver.

In accordance with a tenth aspect, there is provided an apparatus comprising a processing resource configured to perform a physics-based simulation of a real or virtual process or system wherein the physics-based simulation comprises performing an iterative process using a numerical solver for one or more times steps to obtain a numerical solution for each of the one or more time steps, wherein performing the iterative process at each time step comprises providing an initial estimate to the numerical solver and applying the numerical solver to a set of equations representative of the real or virtual process or system. For a current time step of the one or more time steps, the processing resource may be configured to: obtain time step information for the current time step; predict an initial estimate for a subsequent time step using the obtained current time step information wherein predicting the initial estimate uses a predictive model characterized by one or more model parameters that are pre-determined using a statistical and/or machine learning derived process; and perform an iterative process using the numerical solver for the subsequent time step thereby to obtain a numerical solution for the subsequent time step, wherein performing the iterative process comprises providing at least the predicted initial estimate to the numerical solver.

According to a eleventh aspect, which may be provided independently, there is provided a computer-implemented method of training a prediction model for use in performing a physics-based simulation of a real or virtual system or process comprising: obtaining simulation data for a plurality of runs of the physics-based simulation, wherein the simulation data comprises time step information for each run of the physics-based simulation, the time step information comprising at least a numerical solution obtained using an iterative process for each time step; performing a statistical or machine learning derived process using the time step information to determine model parameters for a prediction model such that the determined model parameters form a prediction model relating time step information for a current time step to an initial estimate for an iterative process for a subsequent time step; storing the plurality of values for the model parameters of the predictive model.

According to twelfth aspect, there is provided an apparatus comprising a processing resource configured to train a prediction model for use in performing a physics-based simulation of a real or virtual system or process, wherein the processing resource is configured to: obtain simulation data for a plurality of runs of the physics-based simulation, wherein the simulation data comprises time step information for each run of the physics-based simulation, the time step information comprising at least a numerical solution obtained using an iterative process for each time step; perform a statistical or machine learning derived process using the time step information to determine model parameters for a prediction model such that the determined model parameters form a prediction model relating time step information for a current time step to an initial estimate for an iterative process for a subsequent time step and store the plurality of values for the model parameters of the predictive model.

According to a thirteenth aspect there is provided a method comprising: performing a numerical solving process for one or more times steps to obtain a numerical solution for each of the one or more time steps, wherein performing the numerical solving process at each time step comprises providing an initial estimate to the numerical solver and applying the numerical solver to a set of equations representative of one or more fluids in a subterranean reservoir, wherein the method comprises, for a current time step of the one or more time steps: obtaining time step information for the current time step; predicting an initial estimate for a subsequent time step using the obtained current time step information wherein predicting the initial estimate uses a predictive model characterized by one or more model parameters that are pre-determined using a statistical and/or machine learning derived process; and performing a numerical solving process using the numerical solver for the subsequent time step thereby to obtain a numerical solution for the subsequent time step, wherein performing the numerical solving process comprises providing at least the predicted initial estimate to the numerical solver. The method may further comprise performing the one or more actions based on at least the obtained numerical solution. The method may be a method for performing one or more actions associated with either a subterranean environment and/or an associated apparatus.

The method may comprise determining a control parameter for the associated apparatus based on at least the obtained numerical solution. The action may comprise controlling the associated apparatus using the control parameter.

The action may comprise determining a dimension of an oil and gas or other subterranean reservoir based at least on the obtained numerical solution, The method may comprise predicting a production rate from part of the subterranean reservoir based on at least the obtained numerical solution.

The associated apparatus comprises a drill for performing a drilling operation, and wherein the method comprises determining a control parameter for the drill based on at least the obtained numerical solution. The further may comprise performing the drilling operation using the control parameter. The method may comprise determining one or more desired drilling sites for the drill based on at least the numerical solution and wherein the action comprises performing the drilling operation at the desired drilling site.

The method may comprise determining a design parameter for the associated apparatus based at least on the obtained numerical solution. The action may comprise producing the associated apparatus in accordance with design parameter. The design parameter may comprise at least one of: a position of a gas-lift valve, the type of electrical submersible pump or the position of an inflow control device, The method may comprise performing a sensing process using one or more sensors to obtain sensor data associated with the reservoir and wherein the numerical solving process comprises processing at least said sensor data to obtain the numerical solution.

The sensor data may comprise at least one of data associated with the subterranean environment and/or associated apparatus and/or object, for example, geometric, pressures, temperatures, flow rates, material properties The numerical solving process may comprise processing physical data associated with the subterranean environment and/or the associated apparatus. The physical data may comprise at least one of porosity, permeability, viscosity.

The numerical solution may be representative of at least one of oil pressure, oil saturation, water saturation and gas saturation The numerical solving process may forms part of a physics-based simulation. The numerical solving process may comprise an iterative process. The method may comprise a computer-implemented method. The one or more actions may comprises an operation and/or procedure.

According to a fourteenth aspect there is provided an apparatus comprising a processor configured to perform the method of the thirteenth aspect.

The apparatus may further comprise one or more components configured to perform the one or more actions. The apparatus may comprise a controller for controlling one or more components. The apparatus may further comprise at least part of the apparatus associated with the subterranean environment.

In accordance with a further aspect there is provided a computer program product comprising computer-readable instructions that are executable to perform the method of the first aspect or the method of the third aspect or the method of the fifth aspect or the method of the seventh aspect or the method of the ninth aspect or the method of the eleventh aspect or the method of the thirteenth aspect.

Features in one aspect may be applied as features in any other aspect, in any appropriate combination. For example, features of the first to fourth aspect may be applied as features of the fifth to eighth or the ninth to twelfth aspect, or vice versa. Likewise, method features may be applied as apparatus features or computer program product feature, and vice versa. Further, features of the first and second aspects may be applied as features of the third and fourth aspects and vice versa and features of the fifth and sixth aspects may be applied as features of the seventh and eight aspects and vice versa and features of the ninth and tenth aspects may be applied as features of the eleventh and twelfth aspects, and vice versa.

BRIEF DESCRIPTION OF DRAWINGS

Various aspects of the invention will now be described by way of example only, and with reference to the accompanying drawings, of which:

FIG. 3 depicts an algorithm for an iterative process;

DETAILED DESCRIPTION OF THE DRAWINGS

Figure 1:
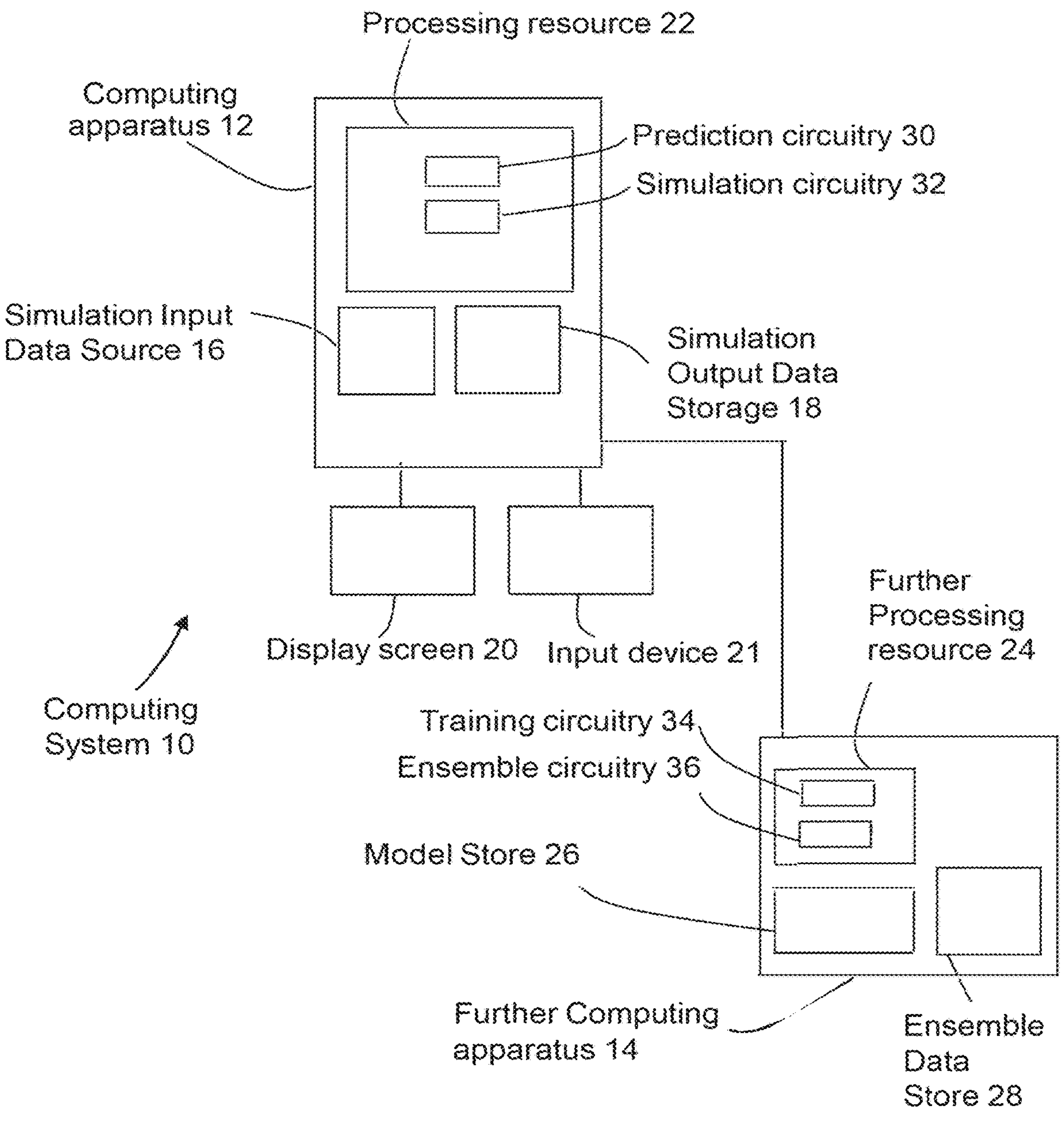
FIG. 1 is a schematic diagram of a system configured to perform a simulation of an oil, gas or hydrocarbon reservoir, in accordance with embodiments.

In the following, methods of performing, assisting or implementing a physics-based simulation of a real or virtual system or process are described. In particular, a method of performing or controlling a numerical solving process are described. In the embodiments described in the following, the system being modelled is an aspect of an oil, gas or hydrocarbon reservoir project. However, it will be understood that the following embodiments may be applied when performing a computer-based simulation in a number of different fields. The following embodiments apply to simulations that are based on using numerical solver to arrive at a converged solution over a number of discrete time steps, as part of a numerical solving process. The example of an oil, gas or hydrocarbon reservoir project will be understood as an example of simulating one or more fluids in a subterranean reservoir or environment: other non-limiting examples include geothermal reservoir modelling and carbon capture and storage (CCS) or carbon capture and sequestration systems.

In the following a description of a specific physics-based simulation for hydrocarbon reservoirs is provided. However, it will be understood that the method and system may be considered as a method that can be used with known physics-based simulations, to assist and/or optimize an aspect of the known physics-based simulation.

The embodiments described in the following relate to simulations of oil, gas and hydrocarbon reservoir projects that use a physics-based model, for example, a physics-based simulation that comprises solving time-dependent partial differential equations in one or more variables (the variable being solved is denoted by variable x). As the partial differential equations are non-linear and cannot be solved directly, in the following embodiments, a discretized representation (in space and time) of the physical or virtual process/system is used. The simulation uses known spatial models, for example, finite element or finite volume or finite difference based techniques. In such simulations, rather a partial differential equation is solved over a number of time steps. For each time step, a closed-form solution does not exist, so the non-linear system is linearized (for example, using a Taylor expansion). The linearized system of equations is then solved multiple times (using an iterative process) until a converged solution of the non-linear system is reached.

In the present embodiment, the physics-based model is based on the known Black Oil model, which is a discrete-time finite volume simulation. The Black Oil model describes the flow of oil, water and gas through porous rock. The known Black Oil model is derived using the physical principles of mass conservation and the continuity equation. The known Black Oil model equates time of change of mass in a region with the mass flux across the region boundary, the flux is driven by pressure differences caused by well operations. It is known that the system of equations to be solved is non-linear due to non-stationary interactions between rock types and fluids. In addition, it is known that parameters such as rock compressibility and relative permeability are altered by changes in fluid pressure and saturation levels. In addition, petroleum fluid undergoes phase changes, between gas and liquid form.

Using the known Black Oil model, the reservoir is modelled as a discrete grid of finite volumes. At each time step, the variables of oil pressure (also referred to as simply pressure: p), oil saturation ($S_o$) water saturation ($S_w$) and gas saturation ($S_g$) are determined using an iterative process. At each time step, a large number of equations are solved simultaneously (each equation corresponding to a finite volume). In the present embodiment, the system only solves for three of the above variables (p, $S_o$, $S_g$) and then determines the remaining variable using values for these variables (by setting $S_w=1-S_o-S_g$). At each time step, the following mass balance equation is solved for each cell (c) and for each fluid (f, where f stands for oil, gas or water):

$$\frac{M_{c,f}(x_t) - M_{c,f}(x_{t-1})}{\Delta t} = F_{c,f}(x_t) + Q_{c,f}(x_t, u_t) \tag{1}$$

where $M(x_t)$ is the fluid mass in the cell at time step t, Δt is the size of the time step, $F(x_t)$ is the mass flow from/to neighbor cells, $u_t$ represents well controls and $Q(x_t, u_t)$ represents well flows. Values for physical quantities, such as porosity, permeability, viscosity, etc. are used to calculate M, F and Q. It will be seen that the above cell equation relates a current time step ($T_t$) with a previous time step ($T_{t-1}$): $x_t$ represents a solution (e.g. oil pressure, water saturation, oil saturation and gas saturation) at a current time step and $x_{t-1}$ represents a solution at the previous time step. In a real-world application, for a single time step, typically the oil reservoir will be represented using a large number of cells, and therefore there will be a large number of equations to be solved simultaneously. A numerical solver is then used to determine a solution $x_t$ for each time step. Further detail on the known Black Oil model can be found in "An Introduction to Reservoir Modelling Using MATLAB—User Guide for the MATLAB Reservoir Simulation Toolbox (MRST)" by Knut. Further details on the assumptions used and the quantities and properties calculated for a Black Oil model simulation are provided in "Efficient General Formulation Approach for Modelling Complex Physics", SPE 119165 by Hao et. al.

In the above-described embodiment, the Black Oil model is described to determine solutions for pressure, oil saturation, water saturation and gas saturation. However, it will be understood that other physics-based models may be used to simulate other physical quantities of interest.

In the context of an oil reservoir simulation, the simulation results may be used for a number of different purposes. For example, the simulation results may be used for exploratory purposes, for example, to determine a location of high hydrocarbon density and therefore to improve prediction of a location for drilling. As a further example, it may be desirable to drill an additional well after having already produced the reservoir for a length of time (for example, 5 years). In such an example, the simulation determines not where the oil was originally but where the oil has moved to now, and thus provides an updated and improved location for drilling. As a further example, locations for drilling may be determined to provide optimal spacing between wells to give, for example more oil, but not too much water. Such an outcome requires the simulation to predict the fluid flow and the speed of fluid flow between wells.

The simulation results may also be used to perform a drilling operation, in a non-limiting example, the simulation results allow the determination of operational parameters of a drill or other equipment. In a further non-limiting example, the simulation results may be used to design parameters for an overall drilling operation. In a non-limiting example, the simulation results can be used to determine an operational parameter such as mud weight for casing equipment. The simulation predicts the pressure in the reservoir. This may have important implications for safety-one of the biggest safety risks when drilling stems from unknown pressure regimes (high or low). The simulation provides a prediction of what the pressure is and based on this prediction, parameters for a well casing design and mud weight (e.g. high mud weight may be required to hold back high pressure when drilling but this can not be too high such that it fractures the formation, this is known as the "drilling window").

The simulation results may also be used to evaluate a time-period for shut-in for pressure condition prior to drilling new wells or to evaluate a financial aspect of a development project. The output of the simulation may also be used for visualization. In the context of oil reservoirs, the simulation may be used for determining platform and well placement or for predicting fluid flow during accumulation and/or production/depletion of an oil reservoir.

The output of the simulation may be used to improve an uncertainty in one or more parameters of the reservoir. In a non-limiting example, a history match process can be performed when building a new model of the reservoir. For example, assuming an oil field has a number of wells (for example, 5 wells) that have been producing for a certain amount of time (for example, 10 years). At regular intervals (for example, on a daily or monthly basis) a measurement is performed to determine how much oil/gas/water these wells produce and their pressure. This information can be used when building a new reservoir model, to history match the new model to fit with the historically observed data. By doing a history match, the uncertainty on physical values such as permeability, porosity, etc. in the reservoir can be reduced to provide a simulation that provide results close to the historically observed data. When the model is used to predict new results as opposed to matching old ones, the uncertainty in question may be, for example, in physical quantities such as porosity and permeability. These values are the same for history matching and prediction. The history match is performed to reduce uncertainty so that the uncertainty is as low as possible for performing predictions. The output of the simulation may also be used to optimize an operational or design parameter—for example, the placement of a new well, the equipment chosen for the new well, the order in which the wells are to be produced for maximum effect, etc. In such applications, uncertainty may be taken into account.

The embodiments described in the following relate to methods and systems that use a second predictive model that is independent of the physics-based model of the oil reservoir. For example, while the physics-based model approximates the oil reservoir using a physical model, for example, using a model based on one or more physical principles, laws, rules or constraints (in the present embodiment, the Black Oil model is based on conservation of mass) the second prediction model is derived using a statistical or machine learning derived process. The second model is derived from previous simulation run data, also referred to as ensemble data. The second model may be considered as data-driven, in contrast to physics-driven.

Rather than replacing the physics-based model, the second predictive model may be considered as an auxiliary or assistant model that assists the physics-based simulation. In particular, the second predictive model is trained on ensemble data that includes historical simulation run data obtained from a number of runs of the physics-based simulation. In the following, the collection of simulations that have been previously run is referred to as an ensemble. Each individual simulation run will be, to a certain degree the same, however, small perturbations may be made for each individual simulation. In the following, a collection of multiple perturbed models is referred to as an ensemble. In the present embodiment, the ensemble data includes simulation output data from simulations runs performed over a lifetime of the reservoir project.

The embodiments described in the following may have particular use when large amounts of perturbed simulations are simulated sequentially. For example, it is known to simulate all the model realizations (e.g. the same underlying physical model with perturbations to the input parameters) independently of each other. A perturbation of the model could be a change in an input parameter, for example, a change in a physical property (for example, porosity, permeability) or a design or operational parameter for an aspect of the reservoir or equipment (for example, well spacing, choke position, mud weight).

In the present embodiment, the perturbation may be a change in a parameter used to set up the simulation or used as part of the simulation. The change in parameter could correspond to a physical property of the reservoir, for example, a fluid viscosity or a porosity of rock. A perturbation could also be, for example, a change in geometry or size of the reservoir being modelled. Typically all variables (potentially in almost all cells) may change, but by varying degree. For example, certain perturbations may cause large changes in pressure, and less in saturation and others may create a low change in pressure, but a given difference in oil vs. water saturations. However, it will be understood that any of these parameters may change between perturbations. It will be understood that, for some perturbations, the majority of the simulation input data will remain the same between different simulations runs in the ensemble. It will be understood that even a small change in input may lead to large changes in the simulation results (for example, a small change in one or more variables or a change in only one variable).

In the present embodiment, the predictive model is used to predict a parameter for the numerical solver, an estimate for an initial guess for the numerical solver. In the present embodiment, using the time step information from the current time step $T_t$ the predictive model is trained to predict a start guess for the solution at the subsequent time step $T_{t+1}$. In the present embodiment, the predicted start guess corresponds to predicted initial values for oil pressure, oil saturation, water saturation and gas saturation for the subsequent time step. In contrast to using the solution for the current time step for the start guess for the subsequent time step, the predicted initial estimate for the subsequent time step may be closer to the actual converged numerical solution for the subsequent time step. It will be understood that, in the present embodiment, the predictor only predicts the variables that is solved for by the non-linear system of equations. All other parameters (e.g. viscosity as a function or pressure) are calculated explicitly by information provided to the simulator.

The present embodiments use intermediate time step information to improve convergence of the iteration process at each time step. By improving performance of the simulation at the time step level, a number of further improvements may be achieved. For example, the time for the subsequent iterative process to obtain a solution may be reduced and/or the number of iterations for subsequent time steps to arrive at a converged solution may be reduced. This may mean that fewer processing resources may be used per simulation run. As a further example, the increase in performance may allow a larger number of perturbed models (e.g. a larger region of the input parameter space) to be explored using the processor. As a further example, as described in the following, the types of system and process that can be modelled may be extended to include systems and processes that include for example, non-linear, chaotic and oscillating systems. Furthermore, the accuracy and/or resolution of the simulation may be improved. A better initial estimate may also improve convergence and may also avoid divergence of the iteration process. Therefore, this may allow for longer time-steps to be taken therefore reducing the overall simulation time.

FIG. 1 depicts a computing system for performing a simulation method in accordance with embodiments. FIG. 1 depicts a computing apparatus 12 connected to a further computing apparatus 14. The further computing apparatus 14 may be provided remotely, for example, connected over a network. The further computing apparatus 14 may therefore be referred to as a remote computing apparatus. The remote computing apparatus 14 may also be referred to a remote server and may correspond to more than one computing resource.

The computing apparatus 12 has a processing resource 14, a simulation input data source 16 and a simulation output data storage resource 18, also referred to, for brevity, as output data store 18. In some embodiments, the simulation input data source 16 and output data store 18 are provided as part of a single memory resource of the computing apparatus 12. The computing apparatus 12 is also connected to a display screen 20 and input device 21. It will be understood that the display screen 20 and input device 21 may be considered as forming part of the computing apparatus 12 itself. The display screen 20 may also be referred to as the display, for brevity. The input device 21 is configured to receive user input data representative of a user input. The further computing apparatus 14 comprises a further processing resource 24, a model storage resource 26 also referred to, for brevity, as a model store 26 and ensemble data storage resource 28, referred to, for brevity, as ensemble data store 28.

The computing apparatus 12 comprises a processing resource 22 and the further computing apparatus 14 comprises a further processing resource 24. In the present embodiment, each of the processing resource 22 and the further processing resource 24 comprises a Central Processing Unit (CPU). For the purposes of the following description, the processing resource 22 is described as having prediction circuitry 30 and simulation circuitry 32 and these circuitries may be implemented in the CPU. The further processing resource 24 is described as having training circuitry 34 and ensemble management circuitry 32 and these circuitries may be implemented in the CPU. In some embodiments, simulation circuitry 32 may be considered as having a separate processing resource, a CPU or GPU, dedicated to the numerical solver.

It will be understood that, in some embodiments, processing steps can be performed on a combination of computer processing units (CPU), graphics processing units (GPUS) and tensor processing units. In particular, in some embodiments, the physical-simulation steps may be performed on a CPU and/or a GPU, while the prediction process is performed on, for example, a CPU or a GPU or a dedicated processing unit (for example, a TPU). In further example embodiments, the processing resource comprises a first processor having the simulation circuitry (implemented on a CPU or a GPU) and a second processing having the prediction circuitry (implemented on a CPU, GPU or TPU). In further example embodiments, the training circuitry of the further processing resource is implemented on one or more CPUs, GPUs and/or TPUs.

In the present embodiment, the various circuitries of the processing resource 22 and the further processing resource 24 are each implemented in their respective CPU of processing resource 22 by means of a computer program having computer-readable instructions that are executable to perform the method of the embodiment. However, in other embodiments each circuitry may be implemented in software, hardware or any suitable combination of hardware and software. In some embodiments, the various circuitries may be implemented as one or more ASICs (application specific integrated circuits) or FPGAs (field programmable gate arrays).

Both the computing apparatus 12 and the further computing apparatus 14 also include a hard drive and other components including RAM, ROM, a data bus, an operating system including various device drivers, and hardware devices including a graphics card. Such components are not shown in FIG. 1 for clarity.

The simulation input data source 16 provides simulation input parameters and simulation input data for the processing resource 14. In some embodiments, the simulation input data source is provided remotely, for example, is obtained from a further computing apparatus 24 over the network. In the present embodiment in which an oil reservoir is being simulated, the simulation input data comprises data representative of the reservoir being simulation. The precise types of input data provided will depend on the model and purpose of the simulation. Further description of the simulation input data is provided with reference to FIG. 2.

In the present embodiment, as described in further detail with reference to FIGS. 4 and 5, upon completing the simulation, the simulation output data storage is stored both locally at simulation output data store 18 and transmitted to further computing apparatus 14 over the network to be stored at the ensemble data store 28.

The model store 26 provides storage for model data. In particular, trained model parameters and model architecture parameters are stored in the model store 26. In the present embodiment, the model store 26 is provided remotely at further processing resource 24 and the relevant model parameters are retrieved by computing apparatus 12 as part of the simulation method.

In the present embodiment, the circuitries of the processing resource 22 operate as follows. Prediction circuitry 30 is configured to perform a prediction process in which a numerical solver parameter, in this embodiment, the initial estimate for a subsequent time step, is predicted by providing current time step information as input to a trained model. Simulation circuitry 32 is configured to perform the physics-based simulation, including initializing parameters and performing an iterative process at each time step using a numerical solver to obtain a converged solution for that time step. Training circuitry 34 is configured to perform a training process of the model using data stored in ensemble data store 28. Ensemble circuitry 36 is configured to collect in a central location, results from simulations that form part of an ensemble. The ensemble circuitry 36 manages incoming simulation data (produced during or after a simulation run) in response to simulation runs being completed, including storing and processing the simulation data. The ensemble circuitry 36 may also be referred to as an ensemble manager.

While the prediction circuitry 30 and simulation circuitry 32 are provided as part of the computing apparatus 12 and the training circuitry 34 and ensemble circuitry 36 are provided as part of the further computing apparatus 14, it will be understood, that in some embodiments, the prediction circuitry 30 and/or the simulation circuitry 32 is provided as part of the same computing apparatus as the training circuitry 34 and/or ensemble circuitry 36. In particular, in some embodiments, the prediction and/or simulation steps may be performed remotely from the first computing resource, such that instructions and input parameters are transmitted to the further processing resource, the further processing resources performs the prediction and simulation steps and then returns at least some of the results to the first processing resource 14. The first and second processing resources may be provided remotely from each other and may communicate over a network, for example, While FIG. 1 shows a single computing apparatus 12 connected to a further computing apparatus 14, it will be appreciated that more than one computing apparatus may be connected the further computing apparatus such that the further processing resource 24 collects simulation data from more than one computing apparatus. In some embodiments, it will be understood that different steps of the methods described herein and/or different circuitries of processing resource 22 may be implemented in different apparatuses.

Figure 2:
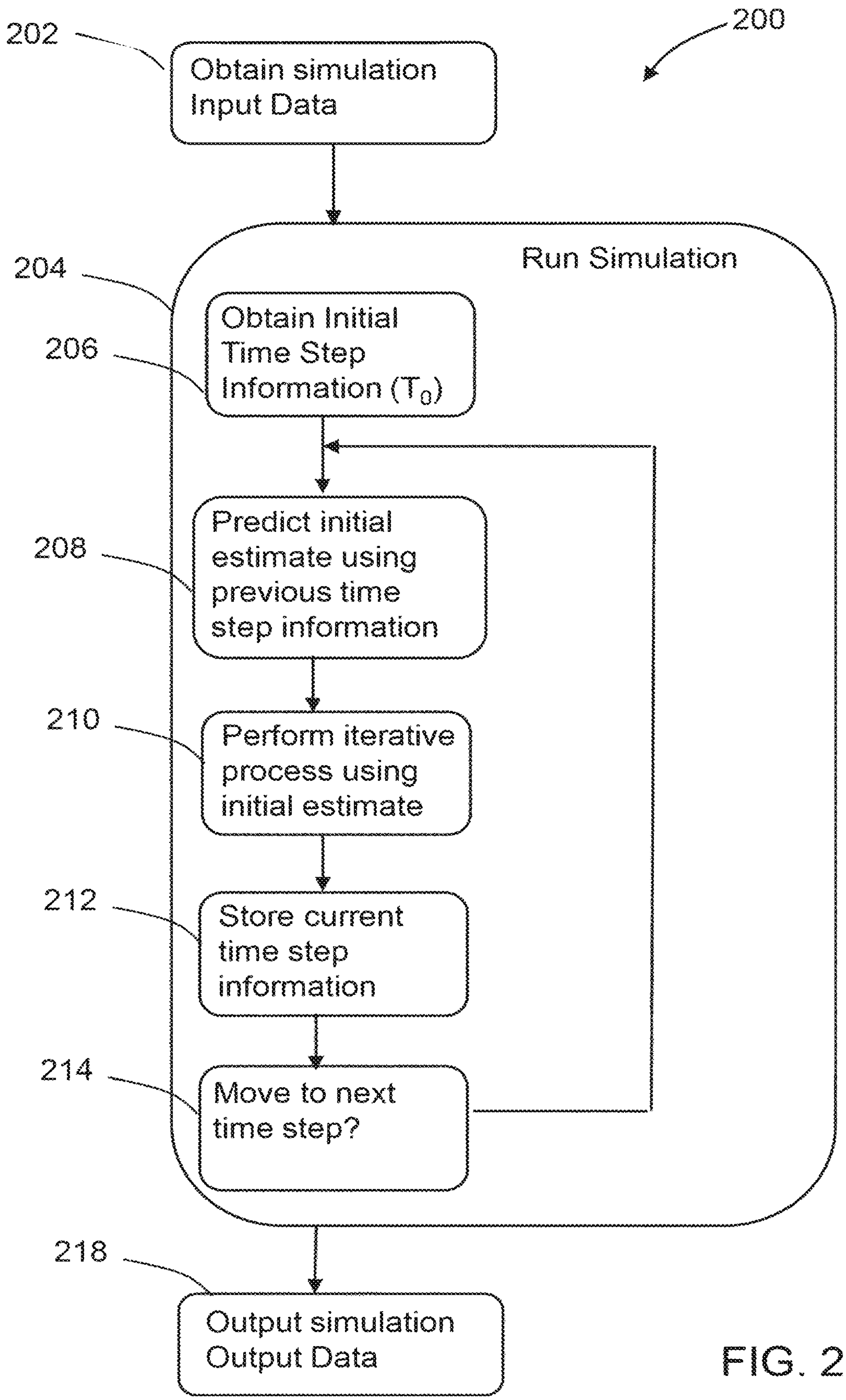
FIG. 2 is a flowchart depicting a method of performing a simulation of an oil, gas or hydrocarbon reservoir in accordance with embodiments.

FIG. 2 is flowchart of a method 200 of performing a simulation, in accordance with an embodiment. In the present embodiment, the simulation is a simulation of fluid flow in an oil reservoir, however, it will be understood that this application is provided for the purposes of the following description and the method may be applied to other fields. For the method 200, it is assumed that a number of simulations of the oil reservoir have been completed already to provide ensemble data and that a training process to train a predictor has been performed prior to method 200. Further detail regarding the training process is provided with reference to FIG. 4. For the purposes of the following description, it is assumed that there is a trained predictor. As described in further detail in the following, the trained predictor uses a prediction model that is representative of a relationship between one or more input features based on the time step information of the current time step and an output comprising a predicted initial estimate for the subsequent time step. Further detail regarding time step information used is provided in the following.

At step 202, simulation input data is obtained. In the present embodiment, the simulation input data is obtained from simulation input data source 16 by processing resource 22, for example, by simulation circuitry 32. Step 202 may be considered as part of a pre-processing step of a simulation workflow. At step 202, the spatial model on which the simulation is based is initialized. In the present embodiment, the spatial model is a 3-D grid of the physical oil reservoir created in accordance with known finite volume methods. However, it will be understood that other known spatial discretization models may be used.

In the present embodiment, a single simulation is performed over a pre-determined real-time period. For example, the simulation may be a simulation from day 0 to day 365 of an oil reservoir. The pre-determined real time period is divided into smaller time steps to give a sequence of times, $T_0, T_1, T_2, \ldots, T_N$ where N is typically not known up front, because the time-step, dt, between the times can vary.

Step 202 involves obtaining simulation input data for the simulation run. The simulation input data includes simulation initialization information for use in setting up or for use during the simulation run, including information used by the numerical solver and initial conditions for parameters for the simulation. These initial conditions include initial values for the quantity that is being solved for, in this embodiment the fluid pressures and fluid saturations.

The simulation initialization data includes data related to a spatial discretization process for the simulation. As the physical system being simulated is represented as a spatial grid comprises a plurality of cells, the initialization data includes, for example, a spatial discretization parameter for example, a grid or volume size, shape or number or time discretization parameter, for example, a time step size. A value for these parameters may be pre-selected or may be user selected.

The simulation input data also includes initial and/or constant values for the physical simulation information, in particular, values for parameters that are used during the simulation. This information includes values of the physical properties for each cell of the spatial grid. In the present embodiment, the physical simulation information comprises at least one parameter that is representative of the oil reservoir being modelled, for example, one or more of porosity, permeability, flow conduit, fluid saturation, geometry, viscosity, density, mechanical strength. In some embodiments, it will be understood that some parameters may change in time (for example, porosity, relative permeability, viscosity, etc.) and some parameters may not change in time (for example, permeability and/or cell size). If a parameter changes in time, information will be provided to the simulator as to how the parameters change as a function of either pressure or one of the three saturations (maybe more than one of these variables). The initial conditions (initial variable values) are therefore provided to the simulator. Other than this, the reservoir is "initialized", which means the pressure and saturations in each cell is determined at time=0. In some embodiments, the initialization is based on a physical model.

It will be understood that, at the ensemble level, one or more aspects of the simulation input data may be varied between simulation runs. For example, perturbations of the simulation input data may include a change in physical properties of the cells (i.e. the physical simulation information) or a change in the simulation initialization information. As a non-limiting example, in the present embodiment, the geometry or porosity could change between a first simulation run and a subsequent simulation run.

At step 204, the simulation run starts. In the present embodiment, the simulation run is performed by processing resource 22, for example, simulation circuitry 32, of computing apparatus 12. As described previously, the physics-based simulation comprises solving time-dependent partial differential equations for one or more variables (denoted x). As these partial differential equations are non-linear and cannot be solved directly the problem is cast as solving a series of linear equations over a number of iterations. The iterative process is performed over multiple time steps (there are multiple iterations of solving linear systems for each a single time step). In the present embodiment, the equations are solved for quantity x which is representative of a physical property of fluid flow in the oil reservoir (in the present embodiment, fluid saturations and fluid pressure).

At each time step (except for the initial time step, which is referred to as the zeroth time step and corresponds to setting up of the initial conditions) an iterative process is performed using a numerical solver to arrive at a converged solution for that time step. The numerical solver requires an initial guess for the solution of the iterative process. In the present embodiment, the numerical solver is a Newton iteration based method, however, it will be understood that other numerical solvers can be used in other embodiments (for example, a Runge-Kutta based method). In the present embodiment, the solver calculates a value for a quantity of interest related to the oil reservoir over the spatial domain. In the present embodiment, this quantity is oil pressure, oil saturation, water saturation and gas saturation however, it will be understood that, in other embodiments, the quantity being solves may be another property of the fluid, for example, a fluid velocity, a fluid pressure, or other variable of interest. Further detail regarding the numerical solver is provided with reference to FIG. 3.

The simulation thus involves evolving (or integrating) the physical model forward in time (over a number (N) of time steps). It will be understood that, for some applications only the solution $X_N$ at the final time-step ($T_N$) is of interest. However, for other applications there is an interest in the converged solution at one or more intermediate time-steps e.g. the solutions $x_1$ at time step $T_1$ up to the solution $X_{N-1}$ at time step $T_{N-1}$. Regardless of whether intermediate time step solutions are of interest, for all simulations, an iterative process is performed at each time step to evolve the model forward in time via the intermediate time-steps. The present embodiment provides a solution and intermediate time step data for all intermediate time steps.

In the following description, the simulation includes the step of predicting an initial start guess, using a prediction function also referred to as a predictor, for the next time step using the current time step information. If the current time step is denoted $T_t$ and the next time step is denoted $T_{t+1}$ then the solution from the current time step is denoted $x^t$ and the solution for the subsequent time step is denoted $x^{t+1}$.

The time step information used by the predictor includes information generated by the simulation, for example, information generated during an iterative process of the current time. The time step information also includes information used by the simulation, for example, information used during the iterative process. A description of examples of time step information that is used in the present embodiment is provided, however, it will be understood that, in some embodiments, not all of this information will be used (i.e. only a selection is required). However, the selection of time step information used will depend on different reservoirs and for different types of simulation.

For the purposes of the following description, the time step information used by the predictor is group into two categories: grid properties and performance indicators. The grid properties correspond to quantities that have a value for each individual cell (or volume) of the grid. For example, the grid properties included properties such as porosity, permeability, viscosity, relative permeability.

Some of the grid properties used may be considered as information generated by the simulation and may changed at every time step. These properties can be referred to as dynamic properties or dynamic data. Some of the grid properties may be considered as information used by the iterative process. Some of the grid properties and some may be considered as information used by the simulation that does not change between time steps, also referred to as static properties or static data The static properties include the information provided to the simulator which includes, but is not limited to: the grid used and one or more spatial discretization parameters (such as a cell volume size, shape or number, length of cells in any direction, length of cell in the x-, y-, z-direction, a cell depth). The static data further also include quantities that correspond to physical quantities, such as porosity, permeability and net-to-gross parameter.

The dynamic properties include properties which may change at every time-step due to changes in, the present embodiment, values for the pressure and saturations. For each iterative process, values for the dynamic properties are updated. This may be performed using a calculation (for example, using a pre-determined mathematical function) or by retrieving a value from a look-up table. The dynamic properties include quantities that correspond to physical quantities, such as, pore volume, formation volume factor, viscosities, relative permeability, effective permeability, phase mobility, rock compressibility. In the present embodiment, the dynamic properties also include derivatives of the above mentioned variables with respect to the either of the quantities being calculated (pressures or saturation). Pore-volume is cell-volume multiplied by porosity therefore when porosity changes in time, so does pore-volume (cell volume is constant).

While porosity may be considered as part of the static data it can also be considered dynamic as it can change at every time-step (due to deformation of the rock under pressure). However, it is conventional in oil & gas to consider porosity part of the static data but it will change in time.

In addition to the above properties, as discussed above, determined values for the variables that are solved for the previous time step are used as input to the predictor. These quantities (pressure, oil saturation, gas saturation and water saturation) can also be considered as dynamic grid properties. In addition, quantities derived from the solution of the time step and/or previous time steps can be used. In the present embodiment, derivatives of these four quantities with respect to time are used as input to the predictor. The derivative with respect to time may correspond to a measure of a change in values for the solution variables between two previous time steps. While these values are not determined by the solution, values are calculated and used as input to the predictor.

In addition to grid properties (including both dynamic and static properties and dynamic properties derived from the solution), in some embodiments, performance indicators are also provided to the predictor. In contrast to the grid properties, these data are related to the performance of the simulator in solving the numerical problem and are not provided per grid cell (but rather a single value for the simulation itself). The performance indicators may change at every time step. Like the grid properties, some performance indicators may be considered as information used by the simulation, for example, information used during the iteration process or by numerical solver, and some performance indicators may be considered as information generated by the simulation, for example, information generated during the iteration process or by the numerical solver.

In further detail, the performance indicators include current time (of the simulation), the time-step length, the number of iterations used to solved the system of equations. In the present embodiment, the number of iterations is the number of Newton iterations.

In the present embodiment for oil and gas reservoir, as discussed above, the time-step information used for predicting comprises the current time solution of the system ($x^t$) as well as other grid properties ($p^t$) that are used to form the system of the equations that are solved by the numerical solver. These grid properties may be updated for the current time step or may be determined at the start of the simulation. The time step information also includes performance indicators, as described above.

In the present embodiment, a number of grid properties and performance indicators have been described, however, it will be understood that this is not an exhaustive list. In known physics-based simulations to which these methods can be applied, there are hundreds of such properties updated for each grid or cell for each Newton iteration that may be used to train the prediction model and used as input to the predictor. In addition, it will be understood that other performance indicators beyond those described above may be used. In addition, it will be understood that some of the above properties may be functions of other properties. It will also be understood that, in some embodiments, a subset of the above described grid properties and performance indicators may be used. The predictor used can be considered as a mathematical transformation a first representation of one or more input features based on the time step information of the current time step and a representation of an output comprising a predicted initial estimate for the subsequent time step. In the present embodiment, the predictor uses current time step information comprising at least the obtained numerical solution for the current time step. The time step information is used for predicting the initial estimate for the subsequent time step. The prediction process includes providing the obtained numerical solution for the current time step to the prediction model. Likewise, the other time step information (properties) is denoted $p^t$. The prediction step of predicting the start guess for the next time step $x_0^{t+1}$ can therefore be represented mathematically by $$x_0^{t+1} = ANN(x^t, p^t, \ldots)$$

where ANN is a mathematical function based on an artificial neural network. It will be understood that, the current time step information, including the current solution and properties (for the current time step) are used to predict the start-guess for the solution for the next time step. That is, the predictor is used to predict one time step ahead. In the present embodiment, the artificial neural network is a convolutional neural network. In the above equation, "p" refers to grid properties calculated for each of the grid cells and " . . . " stands for auxiliary parameters, including performance indicators, which are not a property of each cell.

At step 206, initial time step information is obtained for the numerical solver. It will be understood that the initial time step may be referred to as a zeroth time step (time step $T_0$). The initial time step information includes the initial values for the solution $x^0$ and properties ($p^0$) used to set up the simulation (obtained as part of the simulation input data at step 202). In the present embodiment, the initial time step information is retrieved from the simulation input data source 16. While step 202 and 206 are depicted as two separate steps, it will be understood that step 206 forms part of step 202, in some embodiments.

At step 208, an initial estimate for the numerical solver for the current time step is predicted using the previous time step information. In the present embodiment, the initial estimate is predicted by the processing resource 22, for example, the prediction circuitry 30, by processing time step information from the previous time step.

For the first time step ($T_1$) the initial estimate $$(x_0^1)$$

for the numerical solver for the first time step is predicted using time step information for the zeroth time step which corresponds to part of the simulation input data and therefore includes initial values for the solution $x^0$ and initial values for the properties $p^0$. This may be mathematically represented as:

$$x_0^1 = ANN(x^0, p^0, \ldots)$$

At step 210, the numerical solver performs an iterative process using the initial estimate predicted at step 208. In the present embodiment, step 210 is performed by processing resource 22, for example, by simulation circuitry 32. The numerical solver takes, as its initial start guess, $x_0^t$ and converges on a solution $x^t$. For the first time step $T_1$ the initial estimate used is $x_0^1$ and the solver converges on a solution $x^1$.

Step 210 corresponds to performing the iterative process using the numerical solver. The iterative process used in the present embodiment is described in further detail with reference to FIG. 3. While FIG. 3 illustrates algorithm steps for a particular implementation the iterative process, it will be understood that the iterative process may be implemented using different methods. The iterative process described with reference to FIG. 3 takes, as an input, an initial guess for the solution for the time step ($x_0^t$) and a time-step interval $\Delta t$ (the time interval between subsequent time steps) and outputs a solution for the time step ($x^1$).

At step 212, the current time step information is stored for use at the next time step. The current time step information is also stored to form part of the simulation data that is sent to the further computing resource at the end of the simulation to form part of the ensemble. In the present embodiment, the current time step information is stored in the simulation output data store 18, however, in other embodiments, a separate storage resource for the current time step information may be provided. In some embodiments, the current time step information is sent to further computing apparatus over the network in response to terminating the time step. In some embodiments, only some of the current time step information is retained at the end of the simulation.

At step 214, the method 200 determines if there are any further time steps to be completed. If further time steps are required, the method 200 returns to step 208 for the next iteration. It will be understood that steps 208, 210, 212, 214 are repeated until the simulation arrives at a terminating point. In the present embodiment, step 214 is performed by processing resource 22, for example, simulation circuitry 32.

It will be understood that there is not set number of time-steps, but rather a total duration is set. For example, if 30 days are being simulated, that could be simulated using different numbers of time steps of different duration (for example, 8 time steps of 1, 1, 5, 2.5, 5, 5, 5, 5, 5 or 3 time steps 10, 15, 5). Long time-steps can lead to convergence problems, so the simulator uses an adaptive time step process to adaptively change the time-step during simulation time.

For the purposes of the present description of method 200, steps 208 and 210 are described for the second time step. At the second time step, an initial estimate for the iterative process is predicted using time step information from the previous time step (in this case, the first time step $T_1$). This time step information has been stored at step 212.

For the second time step $T_2$ the initial estimate $$x_0^2$$

for the numerical solver for the first time step is predicted using the time step information from the first time step, which may be mathematically represented as:

$$x_0^2 = ANN(x^1, p^1, \ldots)$$

At step 210, for the second time step $T_2$, the numerical solver performs an iterative process to obtain a solution $x^2$ step using the predicted value $x_0^2$ from step 208. The time step information for the second time step is then stored, for use in the third time step. It will be understood that steps 208, 210 and 212 will be repeated for the third time step onwards (up to the final step). It will also be understood that an iterative process at each time step of a sequence of time steps is performed and a numerical solution for each successive time step of the sequence of time steps is obtained. In addition, it will be understood that time step information for each time step is used to predict an initial estimate for the iterative process for the following time step in the sequence of time steps.

At step 218, simulation output data is stored. The simulation output data may include the solution for the final time step as well as converged solutions for intermediate time steps. The simulation output data also includes the time step data for the intermediate time steps. In the present embodiment, the simulation output data is transmitted to the further computing resource to be managed by the ensemble manager. As more simulations are completed, the number of simulation runs making up the ensemble increases, therefore increasing the ensemble data for use in the training process. The simulation data may comprise historical time step data over the lifetime of the oil reservoir. In particular, the ensemble data include intermediate time step information generated during previous simulation runs (for example, time step information generated during the iterative process or time step information used during the iterative process). In the present embodiment, the simulation output data is stored at simulation output data store 18. In the present embodiment, on completion of the simulation, the simulation output data is transmitted to further computing apparatus 14 and included in the ensemble data by storing in ensemble data store 28. At least part of the simulation output data are representative of one or more aspects of the process or system that is the subject of the simulation.

As described above, FIG. 3 provides an example of an iterative process used in the method 200 (in particular, at step 210). This process performs a number of iterations up to a maximum number ($k_{max}$). For each iteration (k) less than the maximum number of iterations ($k_{max}$) the following steps are performed. Firstly, properties and residuals are calculated. For solving equation Ax=b, the residual can be considered as the change in the right-hand side between two iterations of the iterative solver. When the residual becomes 0, no more change occurs and the time-step has converged.

The algorithm then takes the value for the solution for the current iteration $x_k^{t+1}$ and determines if the value is converged. The convergence may be tested using a number of different known methods depending on the iteration process used. While it will be understood that the number of iterations required can change depending on a number of factors, a maximum number of iterations can be set, that once reached, it is concluded that the iterative process is not converging (or not converging fast enough). The time step size is then reduced and the iterative process repeated for the time step size. As a non-limiting example, assume the process is at a first time (2 years) and the time step is 30 days, if the process is unable to converge in a pre-set number of iterations (say 10 newton iterations) then the time step is reduced in accordance with pre-set rules (in the present example to 10 days) and the iterative process is repeated (from time point 2 years). Convergence and/or lack of convergence can be determined using a convergence condition (for example, a measure of convergence is below a pre-determined threshold). Convergence may be determined by a value derived from the residual, in the present embodiment by the norm of the residual.

If the solution for the present time step is not converged, a mathematical representation of the series of linear equations is computed. In this embodiment, the mathematical representation is a Jacobian representation (J). The computed Jacobian is used to determine a vector h in the equation J*h=−r (where J is the Jacobian, r is the residual and h is the increment). Once the equation is solved for h, this vector is added to the present value (for this iteration) of the solution. The method then returns to the first step for the next iteration (k+1).

In the present embodiment, subsequent time steps in the sequence are separated by a time step interval. The method also includes performing an adaptive time-step scheme in which the time step interval is determined based on the convergent behavior of the iteration process. In the present embodiment, the time-step size is adapted based on how many Newton iterations was used relative to the maximum allowed number. It will be understood that this is a simple approach, and more much advanced methods may be implemented in commercial simulation software.

1: if $k < \frac{1}{2}k_{max}$ then

2: $SuccessRuns = SuccessRuns + 1$

3: $\Delta t = \Delta t \cdot (1.0 + 0.1 \cdot SuccessRuns)$

4: else if $k \geq \frac{2}{3}k_{max}$ then

5: $SuccessRuns = 0$

6: $\Delta t = 0.5 \cdot \Delta t$

7: else

8 : $SuccessRuns = 0$

9: end if

10: $\Delta t = \min(\Delta t, \Delta t_{max})$

Figure 4:
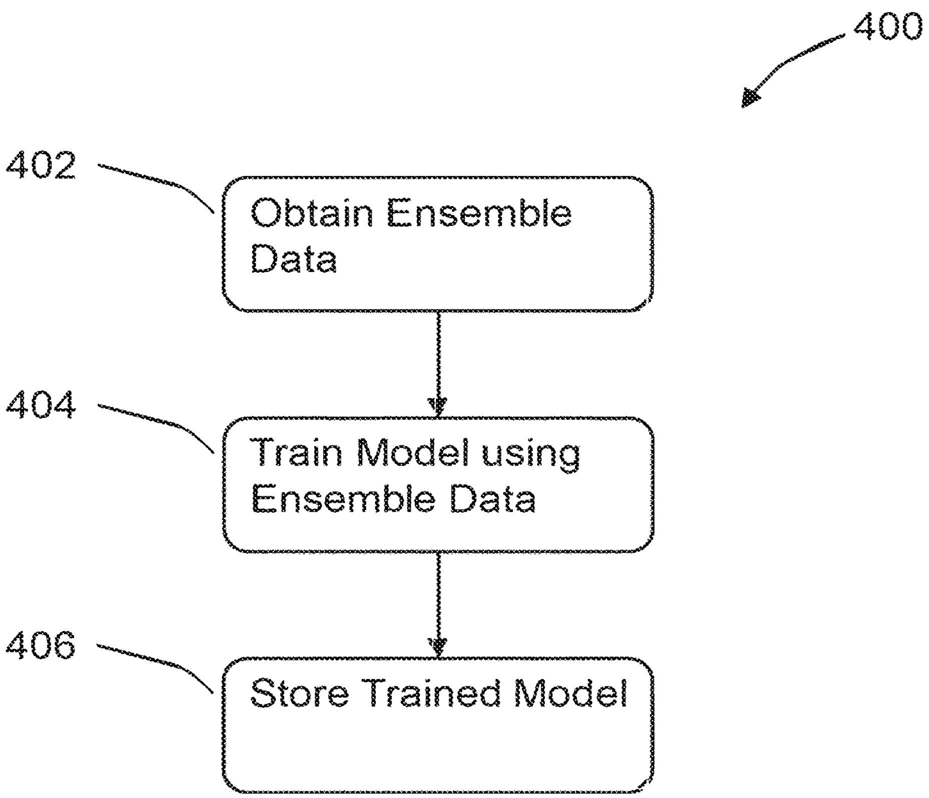
FIG. 4 depicts a method of training a predictor for use in the simulation method, in accordance with embodiments.

Turning to FIG. 4, a method 400 for training the prediction model used in a simulation method, for example, method 200 is described, in accordance with an embodiment. At step 402, ensemble data is obtained. In the present embodiment, the ensemble data is stored in ensemble data store 28 and retrieved and processed by further processing resource 24, for example, by ensemble circuitry 36. As described above, the ensemble data correspond to output data from previous runs of the simulation over the lifetime of the oil reservoir, with slight variations in input simulation parameters (referred to as perturbations). The ensemble data used comprises initial time step information, final time step information and intermediate time-step information for each time-step of each simulation in the ensemble of previous simulations. By using intermediate step data, additional data is provided for training the prediction model, which may lead to a model with greater prediction power. In the present embodiment, the time-step information includes both solution of the iterative process at each time step as well as properties used to form the system of equations that are solved. In the present embodiment, the solution of the iterative process corresponds to the fluid saturations and fluid pressure and the properties include physical parameters of the reservoir, for example, relative permeability.

As previously described, the ensemble of previously simulated models (used to train the model) will be slight perturbations of each other, where some input parameters have been varied slightly. In some embodiments, the data sets from the simulations may be obtained as part of a parameter optimization process, for example, a process to find optimal parameters by running the simulation multiple times. This could use, for example, a genetic algorithm or any other optimization algorithm.

At step 404, the ensemble data is processed, in the present embodiment, by the further processing resource 24, for example, by training circuitry 34. The processing of the ensemble data involves using a statistical or machine learning derived technique to determine model parameters. While a number of different machine learning techniques may be used, in the present embodiment, the prediction model being trained is an artificial neural network. The network architecture is first retrieved, for example, from model store 26. An iterative process is then performed to determine values for the model parameters (neural network weights) to optimize a loss function or other training parameter or function (in this embodiment, to minimize the loss function). Once the model is trained, the method proceeds to step 406.

To train the model, for each simulation in the ensemble, simulation data including intermediate time step data is processed and provided to an untrained model. As mentioned previously, it may not be necessary to use all of the properties (for example, permeability may be used but porosity is not used). Therefore, some of the simulation data may be filtered prior to training. The ensemble data provides ground truth data in that, for each previously run simulation, the simulation data defines a relationship between an input and an output for a particular time step. In further detail, for a given time step, referred to as the current time step, the relationship is between an input comprising the numerical solution of the iteration process performed at the current time step and other current time step data and an output (comprising the initial start guess for the subsequent time step. The training process involves performing a model evaluation process for each time step of each simulation of the ensemble data. The model evaluation process involves providing the solution of the current time step and other time step data for the current time step to the prediction model and comparing the output of the prediction model to the ground truth output (i.e. the actual converged solution for the subsequent time step). By iteratively performing this model evaluation step for each intermediate time step, model parameters that optimize a loss function (or other relevant parameter) can be determined thereby providing trained model parameters. While a loss function is described, any function that measures or represents how close the predicted solution is to the ground truth solution may be used.

The training process is determined as complete upon meeting a pre-determined condition. In the present embodiment, the pre-determined condition is that the value of the loss function for the model parameters is less that a pre-determined threshold value (the pre-determined threshold being indicative of the model being sufficiently trained). If not completed the method feeds further intermediate step data to the model. On completion of the training process, the trained model parameters are stored at step 406. In the present embodiment, the trained model parameters are stored at model store 26.

The above description provides an overview of the training process for an optimization algorithm, however it will be understood that the parameters for the model may be obtained using different training techniques, in other embodiments. For example, for a neural network with a large number of weights, instead of meeting a pre-determined threshold, you will typically run a pre-determined number of iterations (referred to as 'epochs'). However, it will be understood that the training process will involve the step of the trained model satisfying a threshold in order to be considered useful.

The predictive model, when trained, can be considered of being made up of a model architecture and trained model parameters. In some embodiments, the predictive model architecture is selected independently of the physics-based simulation or underlying physical model. The untrained model parameters will also be independent of the underlying physical model.

One or more pre-processing steps may also be performed on the ensemble data. For example, the ensemble data may be normalized prior to training. Normalization may ensure approximately equal scales in the training data.

Figure 5:
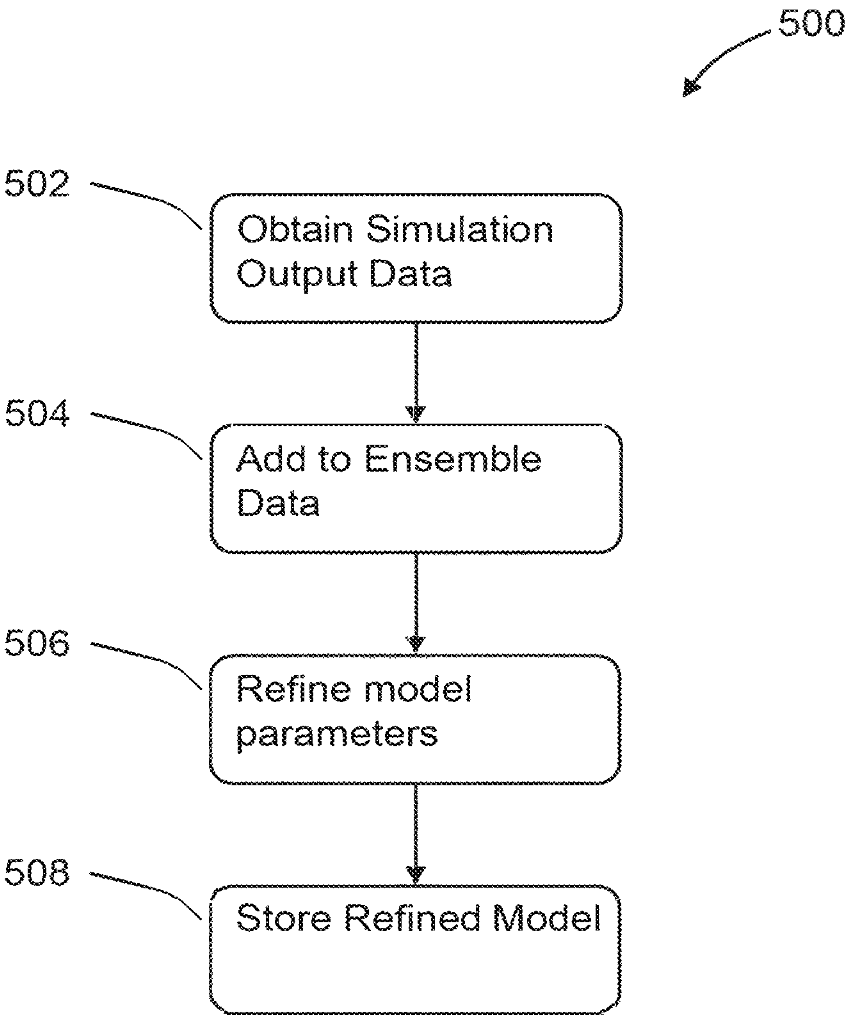
FIG. 5 depicts a method of refining the trained model, in accordance with embodiments.

FIG. 5 depicts a refinement process for refining a trained model in response to further simulations being performed. At step 502, simulation output data is obtained, for example, in response to the completion of a new simulation run.

At step 504, the simulation output data is added to the other ensemble data. In the present embodiment, the simulation output data is transmitted to further computing apparatus 14 and stored at ensemble store 28.

At step 506, the training process, described in further detail with reference to FIG. 4, is repeated thereby to refine the values for the model parameters, in view of the new simulation data. In the present embodiment, a full re-run of the training process is not required. Instead, the refinement process refines the weights by training on the new simulation data (from the recently finished simulations). At step 508, the refined model parameters are stored at model store 26.

The method of FIG. 5 allows the predictive model to be fed by the iteration and run history of simulations that are run over a typical engineering project/life of a field. The further processing resource 24 may be configured to perform the refinement steps, automatically and without user involvement, in response to receiving further simulation run data. As such the method and system operates autonomously such that as soon as an iteration (i.e. the output from the iteration is provided to the further processing resource) the further processing resource automatically updates and refines the predictive model.

In some embodiments, at the start of the lifetime of a project, the oil reservoir, no trained model is present. The simulation therefore is run without using a trained prediction model to predict initial guesses for subsequent time steps. In such embodiments, the training data is obtained over the lifetime of the project and the model is trained and refined as the project progresses.

As described above, the present method may be used to simulate transient states of the system/process. In particular, every time-step could be in a transient state, or a steady-state. Many physical simulations first have a transient phase (for example, could be for 10 time-steps, could be 100). After the transient phase, a steady-state solution is reached, in the stead state the results can be considered as stable. However, in principle, further iterations could be performed for an arbitrary number of time-steps in the steady state. By storing time step information for transient states that do not correspond to steady states, the predictive model can be trained to predict guesses for transient states as well as stead states. The process being simulated may be a chaotic, a non-linear and/or an oscillating process. The system may never reach a steady-state solution, thus the solution at every time-step is different.

The method described in accordance with embodiments, provides that, for every time-step, whether it is transient of steady-state, a correct physical solution will be computed. Rather than known methods, the present methods do not rely on the system reaching a steady-state.

As described above, by providing a method in accordance with the present embodiment, simulations may converge faster and therefore an increase in resolution is possible. In the above-described embodiment, further advantages to improving simulation speed may be found. For example, as each simulation uses fewer processing resources, more simulations may be run (in a given time frame) thereby providing a more robust representation of uncertainty. In one known application, it is known to try and match historic measured pressures and flow rates to the synthetic ones provided by the reservoir simulator so that forecasts can be produced. This is usually performed on a monthly basis and matches are achieved by increasing or decreasing parameters related to the ease of flow. As the present embodiment allows simulations to run faster, an increase in resolution is therefore possible which may allow the actual data seen on a daily or hourly measurement to be replicated in the first simulation model. This increase in complexity may only be possible by having a more efficient solver process (for example, due to fewer computational resource being used).

The above description of specific embodiments is made by way of example only and not for the purposes of limitation.

By way of non-limiting example, in the above embodiment, an artificial neural network is described as being used for the predictive model, however, it will be understood that the other statistical or machine learning derived models may be used. In some embodiments, the artificial neural network may be linked to other networks. With regard to model architecture, for example, filter sizes and number of layers, the selection of these parameters may depend on the type of simulation being performed. While artificial neural networks are described in the above embodiments, other model architectures and predictive functions may be used in other embodiments, for example, polynomials, kriging, radial basis functions.

As a further non-limiting example, the above embodiment is described as a Black Oil based simulation of an oil reservoir, in which particular physical parameters are determined. It will be understood that other physics-based models may be used and other physical parameters related to an oil, gas or hydrocarbon reservoir may also be determined.

In addition, it will be understood that the method may be applied to other applications, in particular, the method is suitable for any physics-based simulation of a physical or virtual system, process or environment in which the simulation uses a grid-based modelling approach and involves performing an iterative process over a number of time steps.

As further non-limiting examples of fields of application, the simulation may be any simulation that uses a computational fluid dynamic model (i.e. based on the principles of fluid mechanics to model systems, processes or environments that involve fluid flow). Such simulations may be based on the principles of Navier-Stokes equations and may solve the equations iteratively as either steady state of transient states.

A further non-limiting example, is the field of engine design, in which an engine may be simulated in order to optimize a design parameter of the engine. In such a simulation, the fluid flow of fuel through a part of the engine may be simulated based on physical principles. In such an example, perturbations between simulation runs could correspond to, for example, a change in the viscosity of the fluid or the size of a nozzle on the engine. In such a simulation, the numerical solver may determine values for one or more physical properties of the fluid and the purpose of running a number of different simulation may be to determine an optimal control or design parameter for the engine (i.e. one that provides fuel efficiency or other benefit). In some embodiments, the method further includes manufacturing the engine using the design parameter. In some embodiments, the method further includes the step of controlling the engine using the optimal control parameter.

The simulation may be of a wind turbine or windmill simulation to simulate behavior of a wind turbine or windmill under different conditions. In a wind turbine application, the fluid flow of air in the turbine may be simulated based on physical principles. In a windmill application, the fluid flow of air around the blades may be simulated based on physical principles. In such an example, perturbations between simulation runs could correspond to, for example, a change in size or shape of the turbine blades or different weather or environmental conditions or placement of the turbine in an environment. In such a simulation, the numerical solver may determine values for one or more physical properties of the fluid and the purpose of running a number of different simulation may be to determine an optimal design parameter for the turbine (for example, the spatial distance between blades) or an optimal operation timetable dependent on weather conditions. In some embodiments, the method further includes manufacturing the turbine in accordance with the determined optimal design parameter. In some embodiments, the method further includes operating the turbine in accordance with the optimal operation timetable.

Other non-limiting examples of fluid flow simulation include, aerofoil simulation, geothermal reservoir simulation, water reservoir simulation.

As a further non-limiting example, the simulation may form part of a graphic rendering process. In such applications, the simulation is of an object or an environment. For example, wind or other effects may be modelled. In such embodiments, the method may include outputting image or video or graphic data representing the object or environment being modelled.

It will be understood that the methods, in some embodiments and application may include, obtaining output data from the simulation or numerical solving process and processing said output data for a number of purposes. For example, the output data my be process to obtain a control parameter for a controllable piece of equipment or apparatus. In some embodiments, the controllable piece of equipment is for performing a drilling operation and wherein the method comprises optionally controlling the controllable piece of equipment or apparatus. In other embodiments, the output is processed to determine a desired dimension of an oil and gas or other subterranean reservoir. In other embodiments, the output is a predicted production rate from the subterranean reservoir. In other embodiments, the output is a proposed drilling site and the method includes the step of performing drilling at the proposed drilling site. In a further embodiment, one or more operational parameter for one or more aspects of a reservoir and/or for a drilling process, for example, position of wells, number of wells, equipment used in the well completion, injection pressure, location of a platform or choke setting. In some embodiments, the method also includes performing a drilling process in accordance with the operational parameter. In some embodiments, the output is processed to determine a design parameter of a reservoir apparatus, for example, a position of a gas-lift valve, the type of electrical submersible pump or the position of an inflow control device. In some embodiments, the method comprises manufacturing the reservoir apparatus in accordance with the design parameter. In some embodiments, the output is an uncertainty in one or more parameters used by the numerical solver process.

As described above, the method may be applied in a number of different fields. It will therefore be understood that, the simulation input data, simulation output data and time step data used will depend on the field of application. However, as described for the embodiments above, in general terms, the time step information will include information used by the simulation, for example, during the iterative process or by the numerical solver and information generated during the simulation run, for example, information generated during the iterative process or by the numerical solver. Generally, the information generated during an iterative process of the current time step includes, for example, for example, the numerical solution for the current time step, 1st derivate information, 2nd derivate information, higher order derivative information, information relating to the number of iterations performed during the iteration process of the current time step. The time step information may also include any quantity derived or generated by combining this information. In addition, the time step information provided as input to the predictor may be classified as grid properties and performance indicators.

In the above embodiment, grid properties and performance indicators were described and it will be understood that the grid properties and performance indicators may be used in a neural network, if the CNN is combined with a different time of neural network, such as a Long-Short-Term-Memory (LSTM) network.

In the above embodiments, the time step information was described as grid properties and performance indicators. The time step information may also be grouped as information related to a spatial discretization process, physical simulation information and real world information. The information related to the spatial discretization process may be, for example, a spatial discretization parameter, a grid or volume size, shape or number or time discretization parameter, for example, a time step size. The physical simulation information may be, for example: at least one parameter representative of a characteristics of the real or virtual system or process, for example, porosity, permeability, flow conduit, fluid saturation, geometry, viscosity, density, mechanical strength. The physical simulation information may be used as part of the set of equations being solved by the numerical solver. The real world information may be, for example, sensor data associated with the system or process, for example, data associated with the environment and/or structure and/or object, for example, geometric, pressures, temperatures, flow rates, material properties. The information related to a spatial discretization process, physical simulation information and real world information may comprise both information generated during the simulation and/or iterative process and information used during the simulation and/or iterative process. The time step information will also include initial time step information including initial conditions and this information may form part of the simulation input data. Obtaining the initial time step information may include setting initial values for one or more of the above parameters (for example, based on real world measurements) and some of these values will be updated between time steps. In some embodiments, the method may include performing physical measurements to obtain real world information. In such embodiment, one or more sensors may form part of a system performing the method and the sensors may obtain sensor data representative of the real world information.

It will be understood that the result of simulations of physical systems may be used for a large number of different purposes. However, often the purpose is related to optimization of design parameters or evaluation of a project, for example, efficiency or production. The following non-limiting examples are provided. The simulation may be for optimizing a parameter of the process or system being simulated. In general, the solution of the simulation will correspond to a quantity of interest, for example, a physical property, design parameter or other aspect of the oil, gas or hydrocarbon reservoir project. The determined solution may correspond to at least one of a liquid flow rate, pressure, temperature, a fluid property or a mechanical property.

A further benefit of having a significantly faster simulator which may be provided by above-descried embodiments is that it enables a Monte Carlo type approach to reservoir modelling and uncertainty analysis to be adopted and allows optimization under uncertainty, which can be a very resource intensive process. The embodiments described above, allow probabilistic decision making to be adopted to determine design and operating parameters of oil reservoirs (and in further embodiments, other simulated systems such as CCUS, Geothermal and Hydrogen applications).

In some embodiments, the real or virtual system or process subject to simulation relates to a wind turbine and one or more parameters including the pitch of each blade, the fluid speed, fluid velocity, blade speed, blade velocity and determined by the simulation. The method may include the step of controlling a wind turbine (for example, the rotation speed, direction, pitch of blades) using a controller, in dependent on one or more of these parameters. In such embodiments, the simulation may use real world data comprising sensor data that is sensed by one or more sensors and the wind turbine may be controlled in dependence on the sensor data. The sensor may include, for example, an environmental sensor, a temperature sensor, a wind speed or direction sensor.

As described above, in some embodiments, the prediction circuitry is provided on a separate processing resource to the simulation circuitry. In some embodiments, the method comprises communicating data between the two processing resources. For example, the initial estimate, as predicted by the prediction circuitry is sent from a first processing resource of the prediction circuitry to the second processing resource of the simulation circuitry.

In the above description the term simulation is used. It will be understood that a run of a simulation may use a numerical solver to obtain a numerical solver such that the numerical solving process forms part a physics based simulation.

It will therefore be clear to the skilled person that modifications of detail may be made within the scope of the invention.

The invention claimed is:

1. A computer-implemented method of performing a physics-based simulation of one or more fluids in a subterranean reservoir or environment and determining a parameter for performing a drilling operation on a well or optimizing production from the well, the method comprising:

obtaining, using a first processing resource, time step information for a current time step of a plurality of time steps, wherein the physics-based simulation comprises performing an iterative process using a numerical solver for one of the plurality of time steps to obtain a numerical solution for each of the plurality of time steps;

predicting, using the first processing resource, an initial estimate for a subsequent time step of the plurality of time steps using the obtained current time step information, wherein the current time step and the subsequent time step are separated by a time step interval and predicting the initial estimate is based on a predictive model characterized by one or more model parameters that are pre-determined using at least one of a statistical or machine learning derived process;

transmitting, using the first processing resource, the predicted initial estimate for the subsequent time step from the first processing resource to a second processing resource over a network;

providing, using the second processing resource, the predicted initial estimate for the subsequent time step to the numerical solver;

performing, using the second processing resource, the iterative process for the subsequent time step using the numerical solver and the predicted initial estimate for the subsequent time step to obtain a numerical solution for the subsequent time step, wherein performing the iterative process for the subsequent time step comprises applying the numerical solver to a set of equations representative of the one or more fluids in the subterranean reservoir and performing an adaptive time-step scheme in which the time step interval is determined based on a convergent behavior of the iterative process and is decreased in response to the numerical solution failing to converge within a desired time or a number of iteration steps;

storing, using the second processing resource, the numerical solution for the subsequent time step;

generating, using the second processing resource, output data from the physics-based simulation;

processing, using the second processing resource, the output data to determine the parameter for performing the drilling operation on the well or optimizing production from the well; and initiating, using the second processing resource, the drilling operation on the well or optimizing production from the well based on the determined parameter.

2. The method of claim 1, wherein the physics-based simulation comprises simulating one or more aspects of the fluid flow in the reservoir or environment based on a known computational fluid dynamics model.

3. The method of claim 2, wherein the simulation comprises a simulation of an oil, gas or other hydrocarbon reservoir, a geothermal reservoir or a carbon capture sequestration and storage system.

4. The method of claim 1, wherein the time step information comprises information generated during the iterative process of the current time step and/or information used by the numerical solver during the iterative process of the current time step.

5. The method of claim 1, wherein the time step information comprises updating values for one or more properties for the current time step using the solutions from one or more preceding times steps and/or time step information from the previous time step.

6. The method of claim 1, wherein the information generated during the current time step comprises at least one of:

the numerical solution for the current time step, $1^{st}$ derivate information, $2^{nd}$ derivate information, higher order derivative information, information relating to the number of iterations performed during the iteration process of the current time step, or values for one or more dynamic properties of the fluid or reservoir or environment.

7. The method of claim 6, wherein the information used during the iterative process of the current time step comprises at least one of: information related to a spatial discretization process, physical simulation information and real world information.

8. The method of claim 1, wherein the current time step information comprises at least the obtained numerical solution for the current time step and wherein predicting the initial estimate for the subsequent time step comprises providing the obtained numerical solution for the current time step or a quantity derived from the obtained numerical solution for the current time step to the prediction model.

9. The method of claim 1, wherein the physics-based simulation comprises performing an iterative process at each time step of a sequence of time steps to obtain a numerical solution for each successive time step of the sequence of time steps wherein the method further comprises using time step information for each time step to predict an initial estimate for the iterative process for the following time step in the sequence of time steps.

10. The method of claim 1, further processing said output data to determine at least one of:

a) a control parameter for a controllable piece of equipment or apparatus for performing the drilling operation;

b) a dimension of the oil and gas reservoir;

c) a predicted production rate;

d) a proposed drilling site;

e) an operational parameter for one or more aspects of the reservoir and/or for the drilling process, wherein the operational parameter comprises one of position of wells, number of wells, equipment used in the well completion, injection pressure, or location of a platform or choke setting;

f) a design parameter of a reservoir apparatus, wherein the design parameter comprises one of a position of a gas-lift valve, the type of electrical submersible pump, or the position of an inflow control device;

g) an uncertainty in one or more parameters used by the simulation.

11. The method of claim 1, wherein the numerical solution may be representative of at least one physical property or quantity of fluid and/or reservoir or environment.

12. The method of claim 1, comprising performing an iterative process at a time step that is associated with a transient state of the real or virtual system or process.

13. The method of claim 1, wherein the physics-based simulation uses a physical model of the one or more fluids in the reservoir or environment and the prediction model is derived using a statistical or machine learning derived process.

14. The method of claim 1, wherein the prediction model comprises model parameters associated with a model architecture and wherein the untrained model parameters are independent of the physics-based simulation.

15. The method of claim 1, wherein the prediction model comprises an artificial neural network based model.

16. The method of claim 1, wherein the prediction model is representative of a relationship between one or more input features based on the time step information of the current time step and an output comprising a predicted initial estimate for the subsequent time step and/or wherein the relationship may comprise a mathematical transformation between a representation of the one or more input features and a representation of the output.

17. The method of claim 1, wherein the prediction model comprises an artificial neural network based model and/or wherein the numerical solver comprises one or more of: a Newton iteration based method, a Runge-Kutta based method.

18. The method of claim 11, wherein the at least one physical property or quantity of fluid and/or reservoir or environment comprises liquid flow rates, pressure, temperature, a fluid property, or a mechanical property.

19. The method of claim 13, wherein the physical model of the one or more fluids in the reservoir or environment comprises a model based on one or more physical principles, rules or constraints.

20. A system for performing a physics-based simulation of one or more fluids in a subterranean reservoir or environment and determining a parameter for performing a drilling operation on a well or optimizing production from the well, the system comprising a first processing resource and a second processing resource communicatively coupled over a network, wherein the first processing resource is configured to:

obtain time step information for a current time step of a plurality of time steps, wherein the physics-based simulation comprises performing an iterative process using a numerical solver for one of the plurality of time steps to obtain a numerical solution for each of the plurality of time steps;

predict an initial estimate for a subsequent time step of the plurality of time steps using the obtained current time step information, wherein the current time step and the subsequent time step are separated by a time step interval and predicting the initial estimate is based on a predictive model characterized by one or more model parameters that are pre-determined using at least one of a statistical or machine learning derived process; and transmit the predicted initial estimate for the subsequent time step from the first processing resource to a second processing resource over the network; and wherein the second processing resource is configured to:

provide the predicted initial estimate for the subsequent time step to the numerical solver;

perform the iterative process for the subsequent time step using the numerical solver and the predicted initial estimate for the subsequent time step to obtain a numerical solution for the subsequent time step, wherein performing the iterative process for the subsequent time step comprises applying the numerical solver to a set of equations representative of the one or more fluids in the subterranean reservoir and performing an adaptive time-step scheme in which the time step interval is determined based on a convergent behavior of the iterative process and is decreased in response to the numerical solution failing to converge within a desired time or a number of iteration steps;

store the numerical solution for the subsequent time step;

generate output data from the physics-based simulation;

process the output data to determine a parameter for performing the drilling operation on the well or optimizing production from the well; and initiate the drilling operation on the well or optimizing production from the well based on the determined parameter.

* * * * *